United States Patent
Yan et al.

(10) Patent No.: US 6,573,131 B2
(45) Date of Patent: Jun. 3, 2003

(54) SILICA ZEOLITE LOW-K DIELECTRIC THIN FILMS AND METHODS FOR THEIR PRODUCTION

(75) Inventors: Yushan Yan, Riverside, CA (US); Huanting Wang, Riverside, CA (US); Zhengbao Wang, Riverside, CA (US)

(73) Assignee: The Regents of The University of California, Oakland, CA (US)

( * ) Notice: Subject to any disclaimer, the term of this patent is extended or adjusted under 35 U.S.C. 154(b) by 0 days.

(21) Appl. No.: 09/900,386

(22) Filed: Jul. 6, 2001

(65) Prior Publication Data

US 2002/0060364 A1 May 23, 2002

Related U.S. Application Data

(60) Provisional application No. 60/288,626, filed on May 3, 2001, and provisional application No. 60/218,102, filed on Jul. 13, 2000.

(51) Int. Cl.[7] .................................... H01L 21/8238
(52) U.S. Cl. .................. 438/207; 423/326; 423/705; 423/713; 423/714; 423/715
(58) Field of Search ............................... 423/326, 705, 423/713, 714, 715

(56) References Cited

U.S. PATENT DOCUMENTS

| | | | |
|---|---|---|---|
| 5,393,409 A | | 2/1995 | Jan et al. |
| 6,117,411 A | * | 9/2000 | Takewaki et al. ........... 423/705 |
| 6,159,871 A | | 12/2000 | Loboda et al. |
| 6,210,749 B1 | | 4/2001 | Bremmer et al. |

FOREIGN PATENT DOCUMENTS

| | | |
|---|---|---|
| WO | WO 99/15280 | 4/1999 |
| WO | WO 00/39028 | 7/2000 |

OTHER PUBLICATIONS

Baskaran, et al. "Low Dielectric Constant Mesoporous Silica Films Through Molecularly Templated Synthesis" *Advanced Materials* (2000) vol. , 12, pp. 291–294.

den Exter, et al., "Stability of oriented silicalite–1 films in view of zeolite membrane preparation" *Zeolites* (1997) vol. 19, pp. 13–20.

Dow Corning, "Dow Corning Announces Breakthrough in Low–k Technology" *Yahoo Finance* (2001).

Dow Corning, "Dow Corning Awarded Patent for Low–K SiCOH Films" *News Release* (2001).

Dow Corning, "Dow Corning Z3MS CVD Dielectric" *Product Information* (2000).

Dow Corning, "Information About FOx–1x and FOx–2x Flowable Oxides" *Product Information* (1997).

(List continued on next page.)

Primary Examiner—David Nelms
Assistant Examiner—Mai-Huong Tran
(74) Attorney, Agent, or Firm—Townsend and Townsend and Crew LLP

(57) ABSTRACT

Thin films for use as dielectric in semiconductor and other devices are prepared from silica zeolites, preferably pure silica zeolites such as pure-silica MFI. The films have low k values, generally below about 2.7, ranging downwards to k values below 2.2. The films have relatively uniform pore distribution, good mechanical strength and adhesion, are relatively little affected by moisture, and are thermally stable. The films may be produced from a starting zeolite synthesis or precursor composition containing a silica source and an organic zeolite structure-directing agent such as a quaternary ammonium hydroxide. In one process the films are produced from the synthesis composition by in-situ crystallization on a substrate. In another process, the films are produced by spin-coating, either through production of a suspension of zeolite crystals followed by redispersion or by using an excess of the alkanol produced in preparing the synthesis composition. Zeolite films having patterned surfaces may also be produced.

54 Claims, 17 Drawing Sheets

OTHER PUBLICATIONS

Flanigan, et al., "Silicalite, a new hydrophobic crystalline silica molecular sieve" *Nature* (1978) vol. 271, pp. 512–516.

Haw, et al., "Solvent–assisted proton transfer in catalysis by zeolite solid acids" *Nature* (1997) vol. 389, pp. 832–835.

Huang, et al. "Fabrication of Ordered Porous Structures by Self–Assembly of Zeolite Nanocrystals" *J. Am. Chem. Soc.* (2000) vol. 122, pp. 3530–3531.

Jansen, et al., "Controlled Growth of Thin FIlms of Molecular Sieves on Various Supports" *Proceedings of the 9th International Zeolite Conference* (1992) pp. 247–254.

Jansen, et al., "Oriented growth of silica molecular sieve crystals as supported films" *J. Crystal Growth* (1993) vol. 128, pp. 1150–1156.

Kirschbock, et al., "Aggregation Mechanism of Nanoslabs with Zeolite MFI–Type Structure" *J. Phys. Chem.B* (1999) vol. 103, pp. 11021–11027.

Kirschbock, et al., "Mechanism of Transformation of Precursors into Nanoslabs in the Early Stages of MFI and MEL Zeolite Formation from $TPAOH-TEOS-H_2O$ and $TBAOH-TEOS-H_2O$ Mixtures" *J. Phys. Chem.* (1999) vol. 103, pp. 4972–4978.

Koegler, et al., "*Growth model of oriented crystals of zeolite Si–ZSM–5*" Zeolites (1997) vol. 19, pp. 262–269.

Koegler, et al. "Oriented coatings of silicalite–1 for gas sensor applications" *Zeolites and Related Microporous Materials: State of the Art 1994 Studies in Surface Science and Catalysis* (1994) vol. 84, pp. 307–314.

Kondoh, et al., "Structural Change in Porous Silica Thin Film after Plasma Treatment" *Electrochemical and Solid–State Letters* (1998) vol. 1, pp. 224–226.

Lu, et al., "Evaporation–Induced Self–Assembly of Hybrid Bridged Silsesquioxane Film and Particulate Mesophases with Integral Organic Functionality" *J. Am. Chem. Soc.* (2000) vol. 122, pp. 5258–5261.

Miller, Robert D., "In Search of Low–k Dielectrics" *Sciences* (1999) vol. 286, pp. 421–423.

Morgen, et al., Low Dielectric Constant Materials for ULSI Interconnects: *Annu. Rev. Mater. Sci.* (2000) vol. 30, pp. 645–680.

Ozin, et al., "Nanochemistry: Synthesis in Diminishing Dimensions" *Advanced Materials* (1992) vol. 4, pp. 612–649.

Seraji, et al., "Sol–Gel–Derived Mesoporous Silica Films with Low Dielectric Constants" *Advanced Materials* (2000) vol. 12, pp. 1695–1698.

Tavolaro, et al., "Zeolite Membranes" *Advanced Materials* (1999) vol. 11, pp. 975–996.

van Santen, et al., "Reactivity Theory of Zeolite BrØnsted Acidic Sites" *Chem. Rev.* (1995) pp. 637–660.

Wang, et al., "Colloidal suspensions of template–removed zeolite nanocrystals" *Chem Commun.* (2000) pp. 2333–2334.

Wang, et al., "Surface Patterned Porous Films by Convection–Assisted Dynamic Self–Assembly of Zeolite Nanoparticles" *Langmuir* (2001) vol. 17, pp. 2572–2574.

Wang, et al., "Pure–Silica Zeolite Low–k Dielectric Thin Films" *Advanced Materials* (2001) vol. 13, pp. 746–749.

Wang, et al., "Controlling Crystal Orientation in Zeolite MFI Thin Films by Direct In Situ Crystallization" *Chem. Mater.* (2001) vol. 13, pp. 1101–1107.*

Yan, et al., "Preparation of highly selective zeolite ZSM–5 membranes by a post–synthetic coking treatment" *Journal of Membrane Science* (1997) vol. 123, pp. 95–103.*

Yan, et al., "Preparation of Zeolite ZSM–5 Membranes by In–Situ Crystallization on Porous $\alpha-Al_2O_3$" *Ind. Eng. Chem. Res.* (1995) vol. 34, pp. 1652–1661.*

Zhao, et al., "Continuous Mesoporous Silica Films with Highly Ordered Large Pore Structures" *Advanced Materials* (1998) vol. 10, pp. 1380–1385.*

* cited by examiner

Figure 2: X-ray diffraction patterns of silicalite a) film (b-oriented) and b) powder (random). * for peak from silicon wafer, ** for peaks from Al holder Figure 3: Dependence of the k value of calcined and silylated fiilms produced by in-situ crystallization on the exposure time to ambient environment (RH=60%)

Figure 4. Dielectric constant as a function of frequency for calcined MFI films, a) in-situ and b) spin-on.

Figure 5. Dependence of the dielectric constant (k) of as-synthesized silicalite film on the exposure time to air with 60% relative humidity Figure 9: IR spectra of (a) spin-on only and (b) microwave-treated spin-on film (8 mn.)

Figure 10: X-ray diffraction patterns of (a) spin-on only and (b) microwave-treated spin-on films (8 min.)

Figure 11: Dependence of k value on the exposure time to air (RH=60%) for spin-on film (three spin-coats)

Figure 14: Dielectric constant as a function of frequency for calcined silicalite spin-on films.

Figure 16: Powder XRD patterns of bulk materials from nanoparticle suspension, a) wide angle, b) low angle.

SILICA ZEOLITE LOW-K DIELECTRIC THIN FILMS AND METHODS FOR THEIR PRODUCTION

BACKGROUND OF THE INVENTION

This invention relates to the provision of new low-k dielectric films for use in semiconductor and integrated circuit devices.

With the continuing decrease in size of microprocessors, low-k dielectrics are required to address some of the challenging problems such as cross-talk noise and propagation delay. These can become more critical to performance and more difficult to overcome as overall semiconductor device size is decreased while capabilities are increased. Among other aims, the industry is engaged in a search for dielectrics having a lower k value than dense silicon dioxide (k=3.9–4.2). The industry expects that low-k dielectric materials, especially materials with a k value lower than 3, and optimally lower than 2.2, will be needed for the design of devices with very small, e.g., 100 nm, features. In addition to the low k value, new dielectric materials must also meet integration requirements. These include a thermal stability in excess of 400° C., good mechanical properties, good adhesion to a variety of surfaces and substrates, low water uptake and low reactivity with conductor metals at elevated temperatures.

A great number of materials have been proposed and studied as potential candidates, including some that demonstrated k values of 2 or lower. Two major classes of such materials are dense organic polymers and porous inorganic-based materials. Some dense organic polymers (e.g., highly fluorinated alkane derivatives such as polytetrafluoroethylene) may have sufficiently low k values, but they have the disadvantages of having relatively low thermal stability, thermal conductivity, and mechanical strength. In addition there is concern that they may react with conductor metals at elevated temperatures.

Among porous inorganic-based low-k materials, sol-gel silica has been extensively studied and is commercially available, for example from Allied Signal or Honeywell under the trademark Nanoglass. Sol-gel silica offers tunable k values, but some major concerns have been cited. It has a relatively low mechanical strength and a wide pore size distribution. Heat conductivity can be a shortcoming, especially with highly porous sol-gels, and this product also can possess a low resistance to electrical breakdown because of some randomly occurring large pores. In addition, its pore surfaces are initially hydrophilic, and require surface treatment to avoid absorption of moisture.

Recently, surfactant-templated mesoporous silica has been studied for low-k dielectric applications. Such materials are described, for instance, by Zhao, et al., Adv. Mater. 10, No. 6,1380 (1998) and Baskaran et al., Adv. Mater. 12, No. 4,291 (2000). This class of materials has more uniform pores than sol-gel silica (with a range of pore size of up to about 100 nm) and has been shown to have promising k values. Like sol-gel silica, however, there are concerns around low mechanical strength and hydrophilicity.

Hydrogen silsesquioxane films have also been under consideration for use as low-k dielectrics. Resins of this type, from which the films are produced, have been described in Lu et al., JACS 122, 5258 (2000) and a number of patents, including the recent U.S. Pat. No. 6,210,749. A series of these has recently been introduced under the trademarks FOx and XLK by Dow Corning. The FOx products are non-porous and have a k value of about 2.9. By incorporating porosity through a complex three-step process involving a high boiling organic solvent and ammonia gellation, XLK films with a lower k value of about 2.0–2.3 can be produced. Other Dow Corning products recently introduced include a trimethylsilane-containing gas (sold under the trademark Z3MS CVD) whose application by chemical vapor deposition can variously produce thin film dielectrics comprised of silicon oxycarbide or silicon carbide. Such technology is described, for instance, in U.S. Pat. No. 6,159,871. However, the k values of such films do not reach the lower end of the desirable range.

It would be advantageous, in light of these developments, to provide a low-k dielectric material that can be applied as a thin film, has relatively small pores (most preferably <5 nm) and uniform pore distribution, with the necessary mechanical strength to be treated by chemical and mechanical polishing (CMP). Preferably, also, such films will have low hydrophilicity or can readily be modified to have low hydrophilicity, so that they would be relatively unaffected by the presence of moisture.

BRIEF SUMMARY OF THE INVENTION

This invention comprises the provision for use in semiconductor devices, of films that are comprised of silica zeolites, as well as methods for making such films, and articles such as semiconductor devices that use or include them.

In one aspect, the invention comprises a semiconductor device having a substrate and one or more metal layers or structures located on the substrate, and further including one or more layers of dielectric material, in which at least one layer of dielectric material comprises a silica zeolite.

In a second aspect the invention comprises a method for producing a silica zeolite film on a semiconductor substrate comprising forming the film by in-situ crystallization, and, as a product, a semiconductor substrate or device having one or more films so produced.

In a third aspect the invention comprises a method for producing a silica zeolite film on a semiconductor substrate comprising forming the film by spin coating, and, as a product, a semiconductor substrate or device having one or more films so produced.

In another aspect the invention comprises a method of production of silica zeolite films having surface patterns, and, as a product, a semiconductor substrate or devices having one or more films so produced.

In a further aspect the invention comprises certain silica zeolite films that are novel per se.

DETAILED DESCRIPTION OF THE INVENTION

Figure 1:
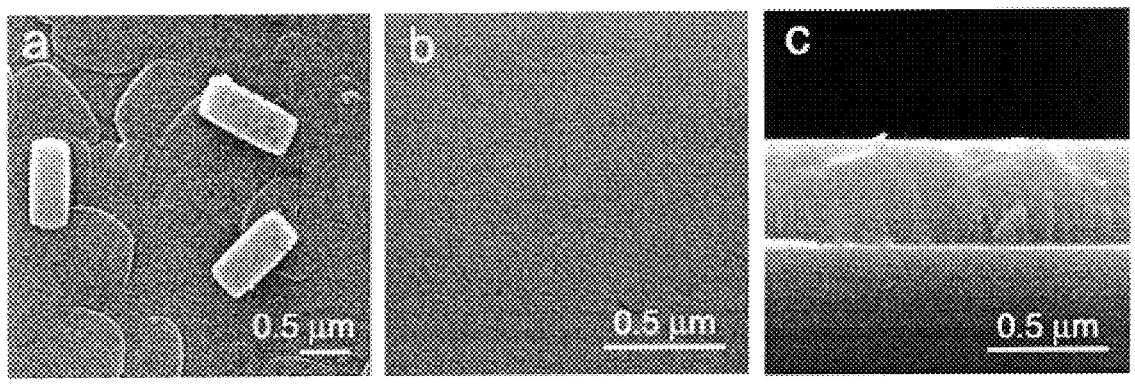
FIG. 1 comprises three SEM scanning electron microscope micrographs of pure-silica MFI films on a silicon wafer produced by in-situ crystallization: (a) before polishing, top view, (b) after polishing, top view, (c) after polishing, cross-sectional view. "MFI" is a code designation issued by the International Zeolite Association for zeolites having a specific topology, i.e. channel or pore structure.

This invention relates to the production and use of thin films of silica zeolites in integrated circuit and semiconductor assemblies or substrates, and for other uses as described herein. The term "silica zeolites" refers to zeolites having only or substantially only silicon and oxygen, and very little or no aluminum or other metals typically found in zeolites. For the purposes of this invention, silica zeolites can contain minor amounts of aluminum or other metals, that is, amounts that do not adversely affect the properties or performance of the resulting films. Silica zeolites of this type are generally referred to as "high-silica MFI zeolites". However, it is preferred that pure-silica MFI zeolites are used in this invention. "Pure-silica MFI zeolites" are silica zeolites having only silicon and virtually no aluminum or other metals. One type of pure-silica MFI zeolite preferred for use in this invention, known as silicalite, is described in Flanigen, et al., Nature, 271, 512 (1978). Other silica zeolites that may be used in this invention include BEA, MCM-22, and MTW. Silica zeolites suitable for use in this invention may be produced either using starting materials containing only silicon and no metals, or may be produced by demetallation, particularly dealumination, of zeolites that contain aluminum or other metals.

Zeolites in general are microporous crystalline materials with generally uniform molecular-sized pores that have been described in general as having low theoretical dielectric constants [e.g., Haw, et al., Nature 1997, 389, 832 and van Santen, et al., Chem. Rev. 1995, 95, 637.]. Their pore size (<2 nm) is significantly smaller than sizes of typical features of integrated circuits. Zeolites have higher heat conductivity (0.24 W/m° C.) than sol-gel silica due to their dense crystalline structure. Unlike organic polymers and inorganic-organic composite low-k materials, pure silica is also known for its compatibility with current semiconductor processes.

Some types of silica zeolite films are known. The production and uses of silica zeolite films are described, for instance, in Jansen, et al., Proc. $9^{th}$ Intl. Zeolite Conf. (Montreal, 1992) and J. Crystal Growth vol. 128, 1150 (1993), Koegeler et al., Studies in Surface Science and Catalysis, vol. 84, 307 (1994) and Zeolites 19, 262 (1997) and den Exter et al., Zeolites vol. 19, 13, (1997). They also are described in a 1999 review article entitled "Zeolite Membranes" by Tavolaro et al. (Adv. Mater. vol. 11, 975). At least some of these films were produced, for instance, by a process similar to the in-situ crystallization process described herein. However, in all these publications the zeolite films were prepared for uses other than in semiconductor or electronic devices—uses that are typical and known for zeolites, for instance as catalytic membranes, for the separation of gases or liquids, or for chemical sensors. In some cases the films were prepared on silicon wafers, among other types of supports. However, there is no mention in any of these publications of the suitability of them for use in semiconductor devices. One publication of two of the present inventors and others discloses production of patterned pure-silica MFI films using a stamp, with a suggestion that they may be useful in microelectronic and opto-electronic applications [Huang et al., J.A.C.S. vol. 122, 3530 (2000)].

In one aspect, this invention thus comprises providing a semiconductor device that comprises a semiconductor substrate, one or more metal layers or structures, and one or more dielectric films, wherein at least one dielectric film comprises a silica zeolite film.

By "semiconductor substrate" is meant substrates known to be useful in semiconductor devices, i.e. intended for use in the manufacture of semiconductor components, including, for instance, focal plane arrays, opto-electronic devices, photovoltaic cells, optical devices, transistor-like devices, 3-D devices, silicon-on-insulator devices, super lattice devices and the like. Semiconductor substrates include integrated circuits preferably in the wafer stage having one or more layers of wiring, as well as integrated circuits before the application of any metal wiring. Indeed, a semiconductor substrate can be as simple a device as the basic wafer used to prepare semiconductor devices. The most common such substrates used at this time are silicon and gallium arsenide.

The films of this invention may be applied to a plain wafer prior to the application of any metallization. Alternatively, they may be applied over a metal layer, or an oxide or nitride layer or the like as an interlevel dielectric, or as a top passivation coating to complete the formation of an integrated circuit.

At least two different processes may be used to prepare the silica zeolite films and the semiconductor devices that include them. These are in-situ crystallization and the spin-on technique.

In both processes, a silica zeolite synthesis composition is first formed by combining a silica source with an organic zeolite-forming structure-directing agent ("SDA"). The silica source is preferably an organic silicate, most preferably a $C_1$–$C_2$ orthosilicate such as tetraethyl orthosilicate (TEOS) or tetramethyl orthosilicate (TMOS). However, inorganic silica sources such as fumed silica, silica gel or colloidal silica, may also be used. The zeolite-forming structure-directing agent is typically an organic hydroxide, preferably a quaternary ammonium hydroxide such as tetrapropylammonium hydroxide (TPAOH), tetraethylammonium hydroxide (TEAOH), triethyl-n-propyl ammonium hydroxide, benzyltrimethylammonium hydroxide, and the like. The resulting synthesis composition contains ethanol, if TEOS is used as the silica source, or methanol, if TMOS is used.

In the in-situ crystallization process of this invention, the molar composition of the synthesis composition is xSDA/1 silica source/y$H_2O$. X can range from about 0.2 to about 0.6, preferably from about 0.2 to about 0.45, and most preferably 0.32. Y can range from about 100 to 200, preferably from about 140 to about 180 and is most preferably 165.

In the in-situ crystallization process, in general, the substrate to be coated is brought into contact with the synthesis composition inside a reaction vessel such as an autoclave. The vessel is then sealed and placed in an oven. If a convection oven is used, heating is generally conducted at a temperature of from about 120° C. to about 190° C., preferably from about 160° C. to about 170° C. and most preferably about 165° C. A microwave oven can also be used, in which case the power level is preferably high and the time is from 5 to 30 minutes, preferably 10 to 25 minutes, and most preferably about 10 minutes. The drying step is preferably followed by heating conducted at temperatures of from about 350° C. to about 550° C., preferably from about 400° C. to about 500° C. This heating step, usually referred to as a calcination step, accomplishes removal of the SDA from the film and can improve the film's adhesion and strength.

Films produced by this process generally have a k value of less than 3.3, in some cases as low as about 2.7. The film thickness is generally less than about 1000 nm, preferably less than about 500 nm.

The films produced by this process are generally hydrophobic; consequently, their properties are relatively uninfluenced by moisture. If desired, hydrophobicity may be increased further by removal of surface hydroxyl groups by silylation, for instance, with chlorotrimethylsilane, as described below, by high temperature oxidation, or by other techniques known in the art for this purpose.

There are two embodiments of the spin-on process, one involving redispersion of zeolite crystals, the other not involving this technique.

In the first embodiment, a zeolite synthesis composition containing an SDA, a silica source (as described above) and water is prepared. The molar composition of the synthesis composition is $x_1$ SDA/1 silica source/$y_1$ $H_2O$. $X_1$ can range from about 0.2 to about 0.5, preferably from about 0.3 to about 0.4, and most preferably 0.36. $Y_1$ can range from about 5 to about 30, preferably from about 10 to about 20, and most preferably 14.29.

In conducting this process, the above synthesis composition is prepared. Then the composition is loaded in a vessel, which is sealed, and the composition is heated to a temperature of from 40 to 100° C., preferably 60–90° C. and most preferably 80° C. The heating time is from 1 day to 7 days, preferably 2–4 days, and most preferably 3 days. A suspension of zeolite crystals is produced.

In this embodiment, the suspension is then centrifuged or otherwise treated to recover nanocrystals (i.e., nanometer-sized crystals). The crystals are then redispersed in ethanol or another appropriate dispersant, and are placed on a substrate that is situated on a spin coater. Spin coating is then conducted as known in the art by rotating the substrate at high speeds such that a highly uniform film is obtained on the substrate. Preferably the film is subjected to a brief drying step (e.g. about 10–12 minutes at 100° C.). Finally the film is subjected to a heating ("calcination") step. This step is conducted at temperatures of from about 350° C. to about 550° C., preferably from about 400° C. to about 500° C. It accomplishes removal of the SDA from the film and can improve the film's adhesion and strength.

In another embodiment of the spin-on process, involving a spin-on of as-synthesized nanoparticle suspension, methanol or ethanol is included in the initial synthesis composition. If a lower alkyl orthosilicate is used as the silica source, methanol or ethanol is chosen as corresponding to the alkyl groups. This is in addition to any amount formed by the hydrolysis of the organic silica source. If an organic silica source is used, either methanol or ethanol may be used. The molar composition of the synthesis composition if $x_2$ SDA/1TEOS/$z_2$ EtOH(or MeOH)/$y_2$ $H_2O$. $X_2$ can range from about 0.2 to about 0.5, preferably from about 0.3 to about 0.4, most preferably 0.36. $Y_2$ can range from about 10 to 20, preferably from about 12 to about 18, most preferably 14.29. $Z_2$ can range from about 1 to about 10, preferably from about 2 to about 6, most preferably 4.0.

In this embodiment it is not necessary to collect and then redisperse the zeolite nanocrystals, and the suspension (without redispersion) is subjected to spin coating as described above, followed by optional drying and then heating or calcination.

Films produced by the spin-on process of this invention generally have a k value of less than 3.2, and in some cases the k value may be as low as about 2.1. The film thickness is generally less than about 800 nm, preferably less than about 500 nm.

The films produced by the spin-on process of this invention are new types of silica films that are distinct from those previously produced by Jansen and others and described in the publications mentioned above. Those films produced in the past were often not completely continuous. However, even when successfully produced as continuous films, they had (as is typical for zeolites) a single, relatively uniform, pore size—an average pore size of about 5.5 Angstroms (this size was generally referred to as "micropores"). The total porosity of such films (ratio of pore volume to total film volume) was about 30–33%

On the other hand, films produced by both embodiments of the spin-on process described herein are continuous bimodal films, having both micropores, as defined above, and larger pores, generally termed mesopores. These films are novel per se, and may be used not only in semiconductor structures as described herein, but also for other uses known for zeolite films such as catalytic membranes, separation of gases or liquids, and chemical sensors.

The micropores of these novel films have an average pore size of about 5.5 Angstroms and a total pore volume of from about 0.15 to about 0.21 cm$^3$/g. The mesopores have an average pore size of from about 2 to about 20 nm, preferably from about 2 to about 10 nm, most preferably about 3 nm. Total pore volume of the mesopores is from about 0.1 to about 0.45 cm$^3$/g, preferably from about 0.2 to about 0.3 cm$^3$/g, and most preferably about 0.25 cm$^3$/g. The total porosity of these novel films is about 50%.

When the zeolite precursor or synthesis composition is formed using excess ethanol or methanol, as above, the resulting suspension may also be used to produce silica zeolite films having surface patterns. Ethanol is preferred for this process. Here, instead of in-situ crystallization or spin coating, the suspension is simply deposited on an appropriate substrate and allowed to dry at ambient temperatures. Surface patterns are believed to form spontaneously as a result of convection due to the evaporation of the excess ethanol. Eventually the suspension dries completely, and the zeolite nanoparticles become locked into solid patterns. The use of ethanol as opposed to another alcohol such as propanol, the presence of excess ethanol in the system (as opposed to only the amount generated between the template and the silica source), and the crystal size in the suspension, are important factors in the production of surface-patterned silica zeolite films by this process. Preferably, the suspension contains crystals of about 25–50 nm diameter, as well as smaller nanoslabs and nanoslab aggregates.

Patterned films produced by the above process are not necessarily disposed in very thin layers, because they have not undergone steps such as spin-on coating to render them so. In addition, they do not necessarily possess k values as low as other films described herein. However, they are considered useful for electronic and other applications.

As described below, the properties of silica zeolite films produced by spin-coating can be varied in several ways. The film thickness can be increased, if desired, by conducting the spin-on process two or more times, with additional material added on each occasion. If the film is produced by the first embodiment of the spin-on process, that is, one in which crystals are redispersed before the spin-on is conducted, the adhesion of the film to the substrate may not be strong enough to withstand treatments such as mechanical polishing. If that is the case, the calcined film can be treated by exposing it to microwaves in the presence of additional zeolite synthesis or precursor solution, or by heating it with additional zeolite precursor solution in a convection oven or similar equipment. This produces a secondary growth of zeolite on the substrate, but if the treatment is kept reasonably brief (perhaps less than 15 minutes for microwaving), the film thickness does not significantly increase.

The films produced by the spin-on processes also are generally hydrophilic. To minimize or prevent adverse affects due to moisture, these films may be made substantially hydrophobic by treatments to remove surface hydroxyl groups, such as by silylation (with chlorotrimethylsilane, for example), high temperature oxidation, or other techniques known in the art for this purpose.

The following examples are provided to illustrate the invention. However, these examples are included as illustrative only, and not with the intention or purpose of limiting the invention in any way.

EXAMPLE 1

This example illustrates an in-situ crystallization process for production of pure-silica MFI films and describes properties of the films so produced.

Thin (controllable between 250–500 nm) b-oriented pure-silica MFI films were prepared on a silicon wafer by in-situ crystallization using a clear synthesis composition with the molar composition being 0.32TPAOH: TEOS: 165H$_2$O (TPAOH=tetrapropylammonium hydroxide; TEOS=tetraethylorthosilicate). A clean-room grade wafer was used, without further cleaning. The wafer (2×2 cm) was fixed in a Teflon-lined Parr autoclave. Crystallization was carried out in a convection oven at 165° C. for 2 hours. As-synthesized film samples were rinsed with deionized water and blow-dried with air. Removal of the organic structure-directing agent (tetrapropylammonium hydroxide) was carried out by calcination at 450° C. for 2 h under air. Pure-silica MFI thin films of equal quality were successfully prepared on low-resistivity silicon (for capacitance measurement), high resistivity silicon (for transmission FT-IR measurement), silicon nitride and silicon dioxide-covered wafers.

Figure 2:
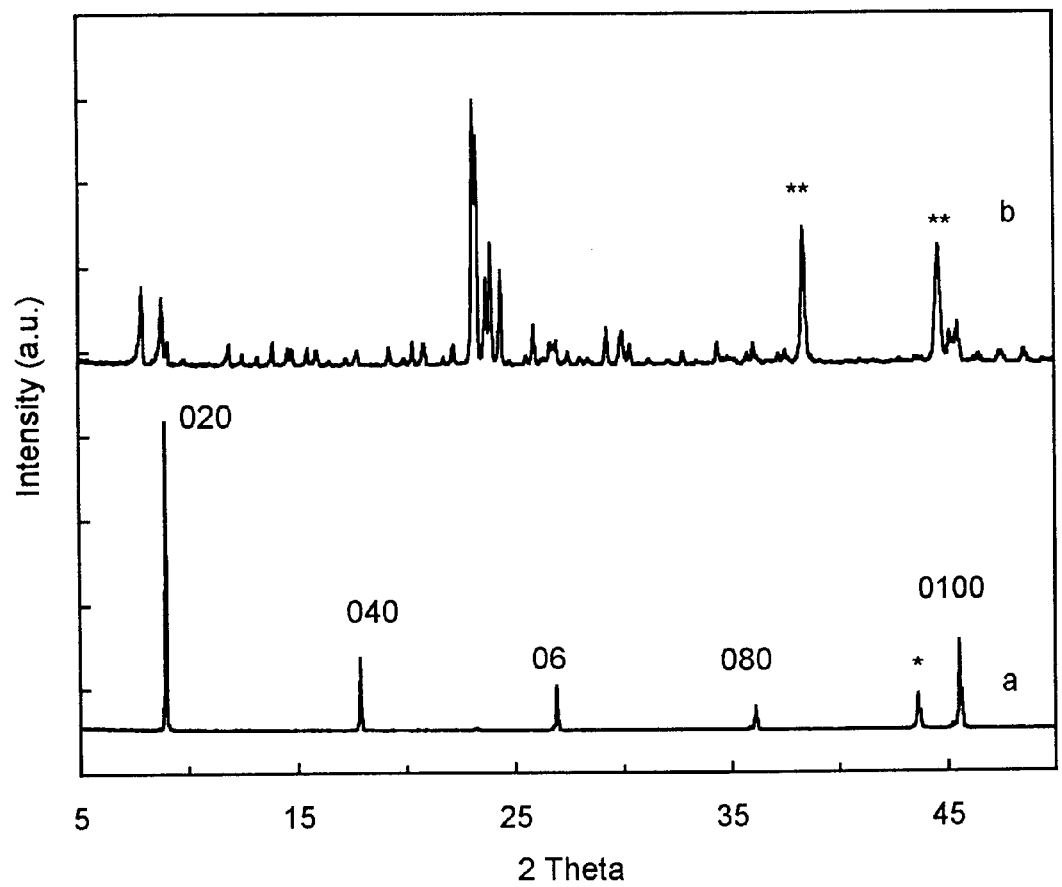
FIG. 2 depicts X-ray diffraction patterns for a pure-silica MFI film of FIG. 1 and a powder MFI sample for comparison.

FIG. 1 shows SEM micrographs of a pure-silica MFI film produced by in-situ crystallization on a low resistivity silicon wafer. The film is continuous, and predominantly b-oriented (FIG. 1a). The orientation of the film was confirmed by x-ray diffraction (FIG. 2). Some twinned pure-silica MFI crystals are present. These can cause minor surface roughness. However, a smooth surface can be obtained by simple polishing for about 10 min with 0.05 μm alpha-Al$_2$O$_3$ suspension using a Buehler polisher. The polished film (FIG. 1b) is shiny and shows a uniform characteristic green color consistent with its thickness. No crack or film delamination was observed during polishing, indicating that the film has excellent mechanical strength and adhesion, and is potentially compatible with chemical mechanical polishing (CMP). A cross-sectional SEM micrograph shows that the polished film has a uniform thickness of 320 nm (FIG. 1c).

The pure-silica MFI film so obtained has an elastic modulus of 30–40 GPa (by nanoindentation). The modulus of sol-gel based films, on the other hand, is often less than 6 GPa. A modulus of 6 GPa is usually considered a threshold value for low-k dielectrics. The modulus of mesoporous silica has been reported to be in the range of 14–17 GPa for a porosity of ~55% and it is expected that the modulus will decrease with porosity. Dense silica has a modulus of about 70 GPa.

Figure 4:
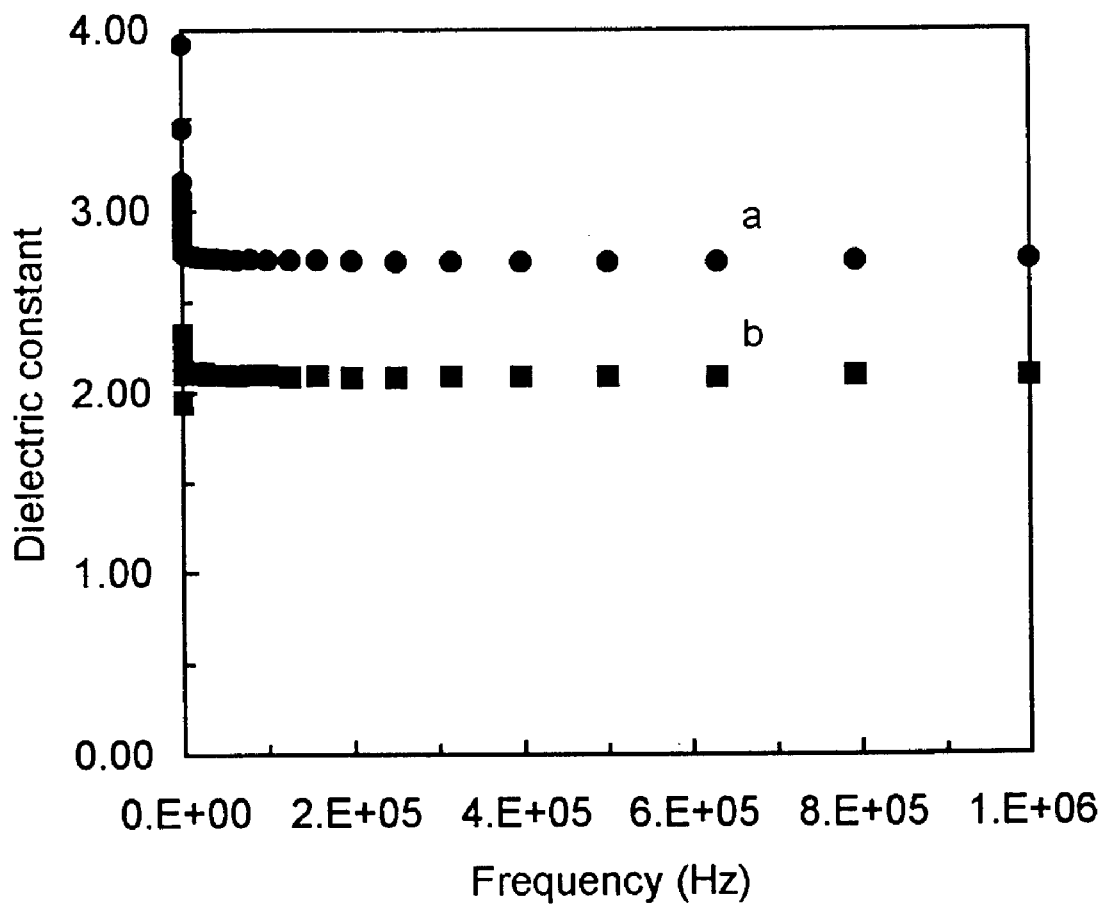
FIG. 4 depicts the dielectric constant as a function of frequency for a calcined pure-silica MFI film produced by in-situ crystallization of the film of FIG. 1 and a film produced by spin-on of redispersed MFI nanocrystals.

To measure the dielectric constant of the film, aluminum dots with a diameter of 1.62 mm and a thickness of 1 μm were deposited on a polished pure-silica MFI film using thermal evaporation deposition through a shadow mask. The reverse side of the sample was etched with buffered hydrofluoric acid to remove pure-silica MFI film; then a layer of aluminum was deposited by evaporation. The dielectric constant of the pure-silica MFI film was calculated by measuring the capacitance of the aforementioned metal-insulator-metal structure using a Solartron 1260 impedance analyzer combined with standard Signatone probe station and micropositioner. Four aluminum dots were usually deposited and the average k value reported. The film sample was dried at 120° C. overnight and saved in a desiccator before capacitance measurement. A dry nitrogen blanket was also applied during capacitance measurement to minimize water adsorption. As-synthesized and calcined films were shown to have dielectric constant values of 3.4 and 2.7 and dielectric loss tangents of 0.013 and 0.018 at 1 MHz, respectively. There is little change of k versus frequency at around 1 MHz (FIG. 4). The k value of the calcined film is consistent with the known porosity of pure-silica MFI (33%).

Figure 5:
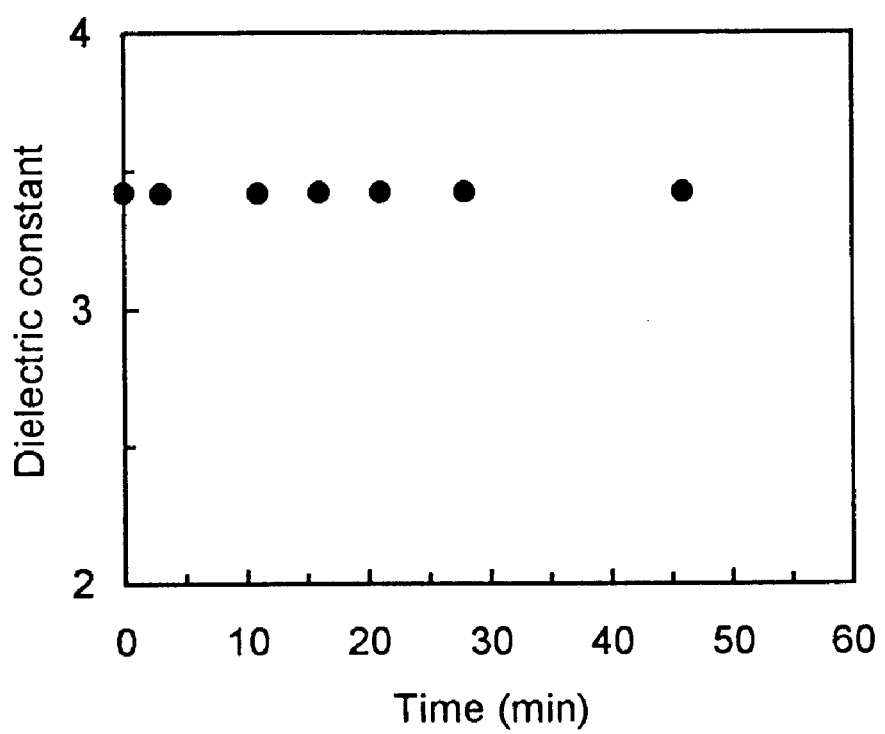
FIG. 5 shows the dependence of the dielectric constant (k) of an as-synthesized pure-silica MFI film of FIG. 1 on exposure time to air, with 60% relative humidity.

The effect of water adsorption on the k value of a pure-silica MFI film prepared by this process was examined by exposing the sample to air at 60% relative humidity and monitoring the k value versus exposure time. As expected, there is no change of the k value with exposure time (FIG. 5).

Transmission FT-IR (Bruker Equinox 55) measurements were conducted on pure-silica MFI films prepared on a high-resistivity wafer. Only a very weak water adsorption band was detected in the calcined samples; this is consistent with the k value measurement.

EXAMPLE 2

Spin-coating with Redispersed Zeolite Nanocrystals

To reach ultra-low k values, the porosity of a pure-silica MFI film can be increased using spin-coating, a process that the current semiconductor industry regards as more friendly than in-situ crystallization. This type of silica zeolite film has a higher porosity owing to the presence of inter-nanocrystal packing voids.

Pure-silica MFI nanocrystals were prepared by the procedure reported in Huang, et al., above; Wang, et al., Chem. Commun., 2333 (2000), as follows. A synthesis composition was prepared by dropwise addition of aqueous TPAOH solution into TEOS with strong agitation, followed by 3 days of aging at 30° C. under stirring. The molar composition of the final clear solution was 0.36 TPAOH: TEOS: 14.29 $H_2O$. The clear solution was loaded into a polypropylene bottle and heated at 80° C. for 3 days, with constant stirring at 250 rpm. The resulting colloidal nanocrystals were recovered by repeated cycles of centrifugation at 15,000 rpm. The centrifugate was recovered after decanting the upper solution, and the product was redispersed in pure water under ultrasonic treatment. The cycle was repeated until the supernatant liquid had a pH<8. Finally the product was redispersed in ethanol for use in spin coating. Nanocrystals so obtained have a uniform diameter of about 50 nm. A Laurell spin coater was used, with a spin rate of 3000 rpm.

Figure 6:
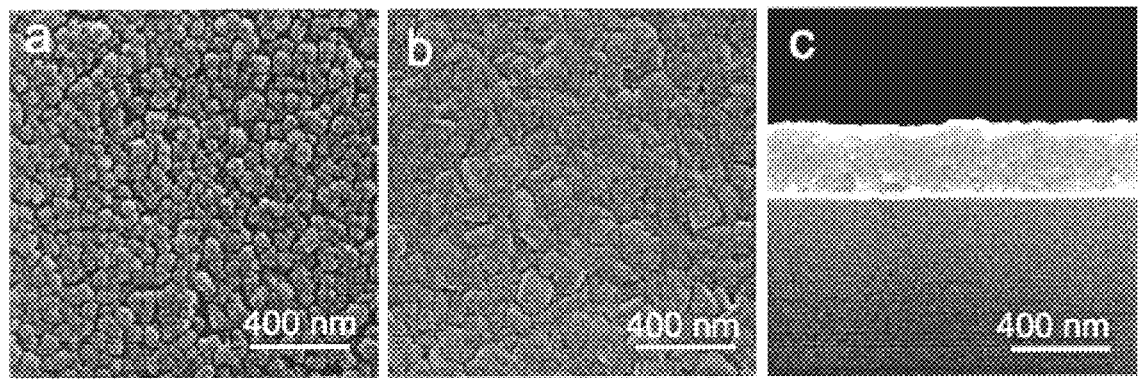
FIG. 6 comprises three SEM micrographs of spin-on pure-silica MFI films produced using a colloidal suspension of nanocrystals: (a) as-deposited, top view, (b) after microwave treatment, top view, (c) after microwave treatment, cross-sectional view.

During the spin coating, the pure-silica MFI nanocrystals self-assembled into a uniform film. This is thought to be a result of hydrogen bonding of pure-silica MFI surface hydroxyl groups while ethanol was evaporated. SEM images show that the films thus produced have a smooth surface with a close-packed structure (FIG. 6a) and a uniform thickness of 290 nm. The film thickness can be controlled by adjustment of the solid loading of the suspension. The film was calcined at 450° C. for 2 h to remove the organic structure-directing agent. $N_2$ adsorption was performed on bulk material obtained using a similar drying procedure and revealed that the film had a uniform inter-particle particle pore size of 17 nm and inter-particle pore volume of 0.40 $cm^3/g$. Capacitance measurement showed that calcined spin-on films have a k value of 1.8–2.1, namely one that reaches the ultra low-k range. The dielectric loss tangent of these films is about 0.0075. The k value changes little with frequency at around 1 MHz

EXAMPLE 3

Variation in Spin Number

Figure 7:
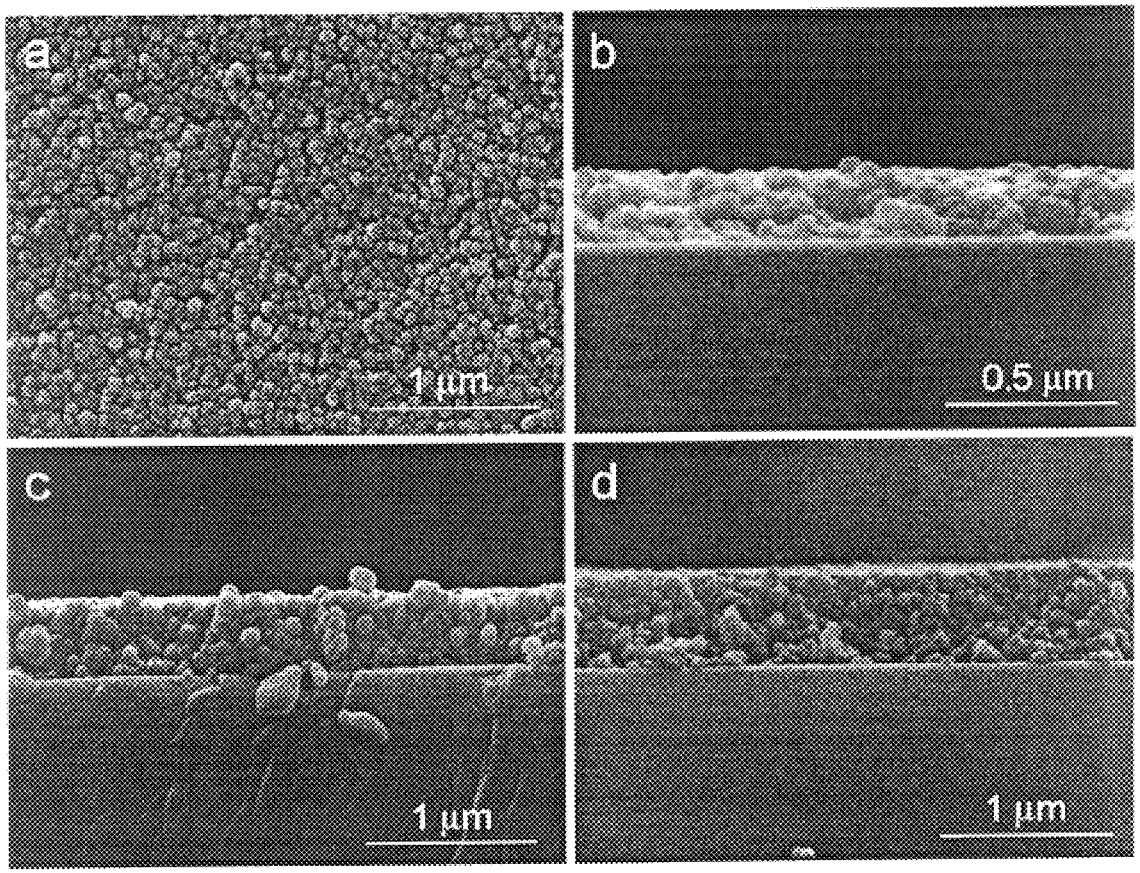
FIG. 7 comprises four SEM micrographs of pure-silica MFI films produced by spin-on of redispersed MFI nanocrystals: (a) top view of a film with one spin; (b) cross-sectional view of a film with one spin; (c) cross-sectional view of a film with three spins (d) cross-sectional view of a film with four spins.

Experiments were conducted to determine the effect on film thickness of conducting the spin-on process several times in succession with a further quantity of synthesis composition added each time. FIG. 7 contains SEM micrographs of the top and cross-sectional views of spin-on films. FIG. 7(a) is the top view of a film produced by a single spin-on. FIG. 7(b) is a cross-sectional view of the same film. FIGS. 7(c) and 7(d) are cross-sectional views of films produced by three and four spin-ons, respectively. The SEM micrographs show that the spin-on film of nanocrystals had a smooth surface with a close-packed structure (FIG. 7a). The film thickness is uniform and can be controlled by adjustment of the number of spin-ons. The film thickness was 240, 420 and 540 nm corresponding to the spin-on number of 1, 3 and 4, respectively. Alternatively the film thickness may be controlled by adjustment of the concentration of nanocrystals in the ethanol solution.

EXAMPLE 4

Secondary Growth by Microwave Treatment of Films Prepared by Spin-coating of Redispersed MFI Nanocrystals Suspension Although calcination apparently improves bonding strength among nanocrystals through condensation/cross-linking of surface hydroxyls, the films produced by spin-on of redispersed crystals may not be adhered strongly enough to the wafer to withstand mechanical polishing. In addition, the existence of large inter-particle mesopores from nanocrystal packing can be of concern for practical applications. A brief secondary growth of pure-silica MFI nanocrystals can be conducted, if it is desired to reduce mesopore size, by treating the spin-on film with a silicate precursor solution in a microwave oven.

Microwave treatment of the spin-on pure-silica MFI films using a solution of 0.32TPAOH: TEOS: $165H_2O$ was carried out in a Sharp household microwave oven (700 W). Five grams of solution was used in each treatment. The spin-on film was placed horizontally in a 45 mL Teflon-lined Parr autoclave (for microwave use). Power level 1 (10%) was used. Microwave-treated films were rinsed with deionized water, flow-dried with air and calcined at 450° C. for 2 h under air.

Figure 8:
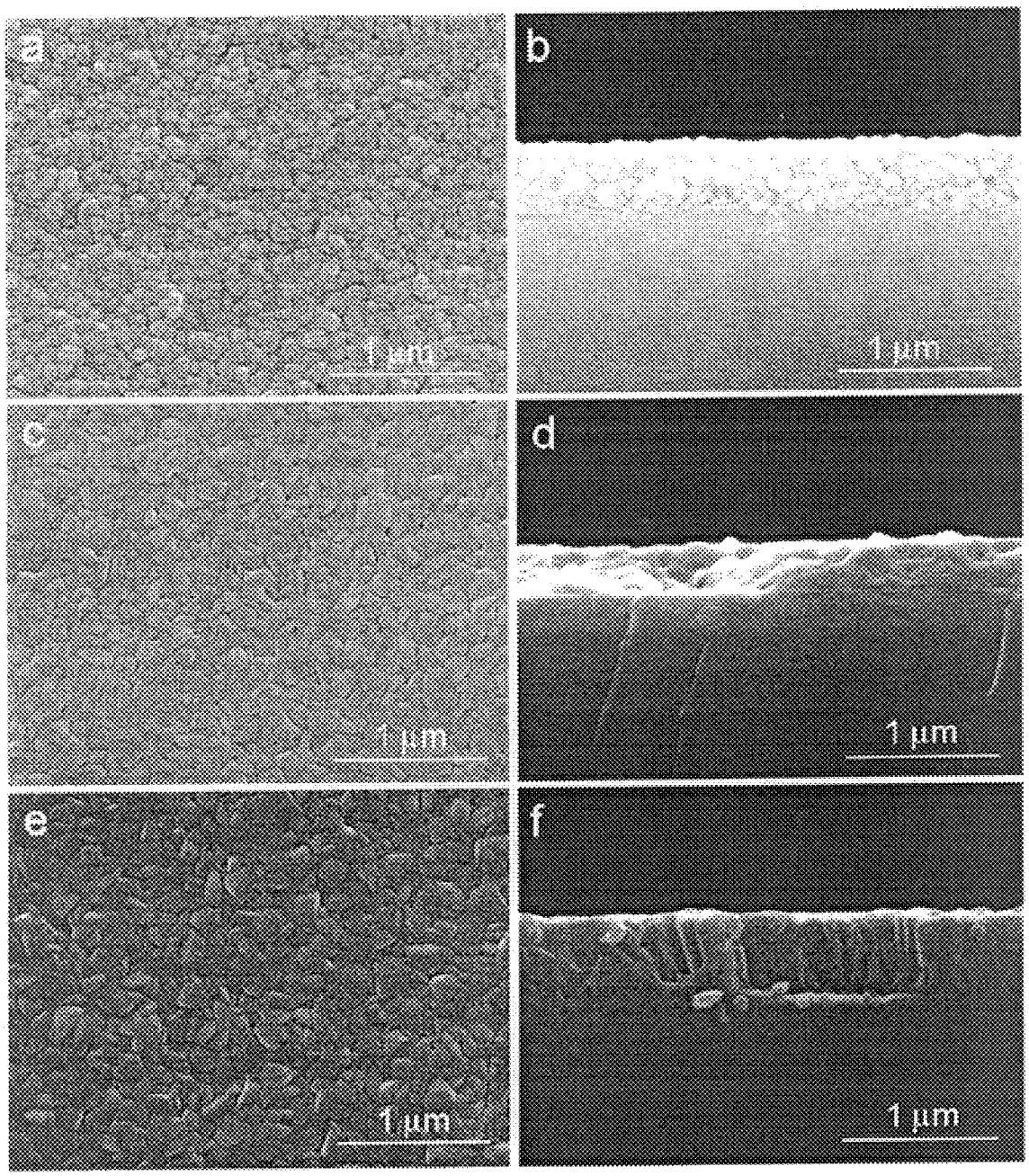
FIG. 8 comprises six SEM micrographs of pure-silica MFI films produced by spin-on of redispersed MFI nanocrystals that were treated with secondary growth by microwaves, with different treatment times.

FIG. 8 shows SEM top and cross-sectional micrographs of pure-silica MFI films with different microwave treatment times. Film #1 (FIGS. 8a and 8b) was prepared with spin-coating for three times, then treated in a microwave for 8 minutes. Film #2 (FIGS. 8c and 8d) was prepared by a single spin-coating, then microwaved for 10 minutes. Film #3 (FIGS. 8e and 8f) was prepared by a single spin-coating, then microwaved for 15 minutes. The SEM images clearly show that the films became more compact after microwave treatment and that the compactness increased with increasing time of microwave treatment. Therefore, it appears that the porosity of these films can be controlled by changing the microwave treatment time. When the microwave treatment time was shorter than 15 minutes, the final film thickness remained unchanged (compare FIGS. 7b and 8d, and FIGS. 7c and 8b). When the microwave treatment time was to 15 minutes, the film became thicker compared to that of the film that had not been microwaved (compare FIGS. 7b and 8f). It was observed that no crystals formed in the bulk phase when the microwave treatment time was shorter than 15 minutes, while formation of crystals was noticed in the bulk phase when the microwave treatment time was longer than 15 minutes. These results indicated that the secondary growth proceeds initially by local epitaxy on the deposited nanocrystal (e.g. within 10 minutes), and that later in the process, deposition proceeds by incorporation of particles from the solution, together with re-nucleation on the growing film (e.g. longer than 15 minutes).

The SEM images clearly show that inter-crystal voids are reduced by secondary growth (see FIG. 8b). A polishing experiment indicated that the mechanical properties of the final film had been significantly improved. Under microwave treatment, the secondary growth produces materials primarily within the nanocrystal matrix, and therefore the final film thickness remains unchanged at 290 nm (FIG. 8c). The calcined film exhibits a k value of 3.0, which is close to that of the in-situ crystallized film.

Figure 9:
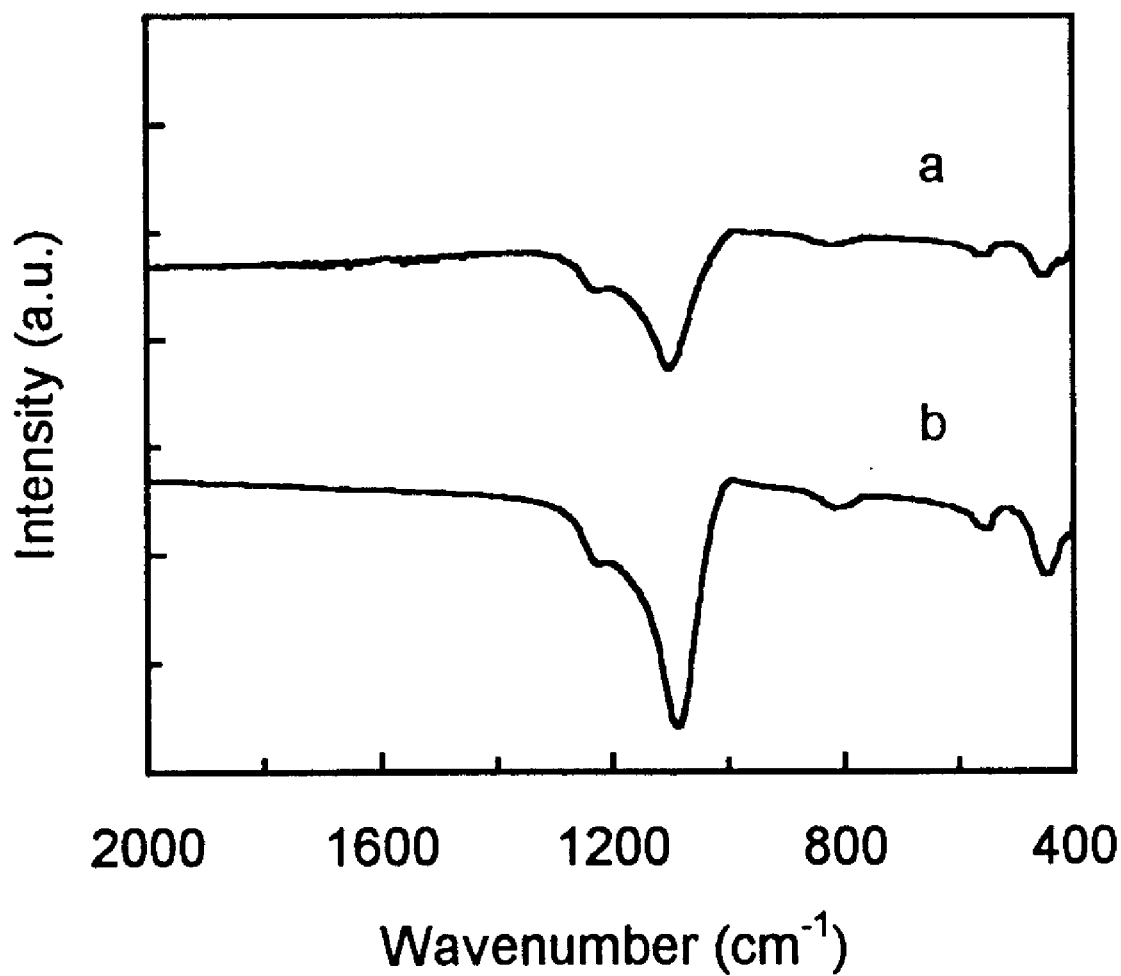
FIG. 9 depicts IR spectra of pure-silica MFI films produced by spin-on of redispersed MFI nanocrystals that were (a) untreated and (b) treated with microwaves after production.
Figure 10:
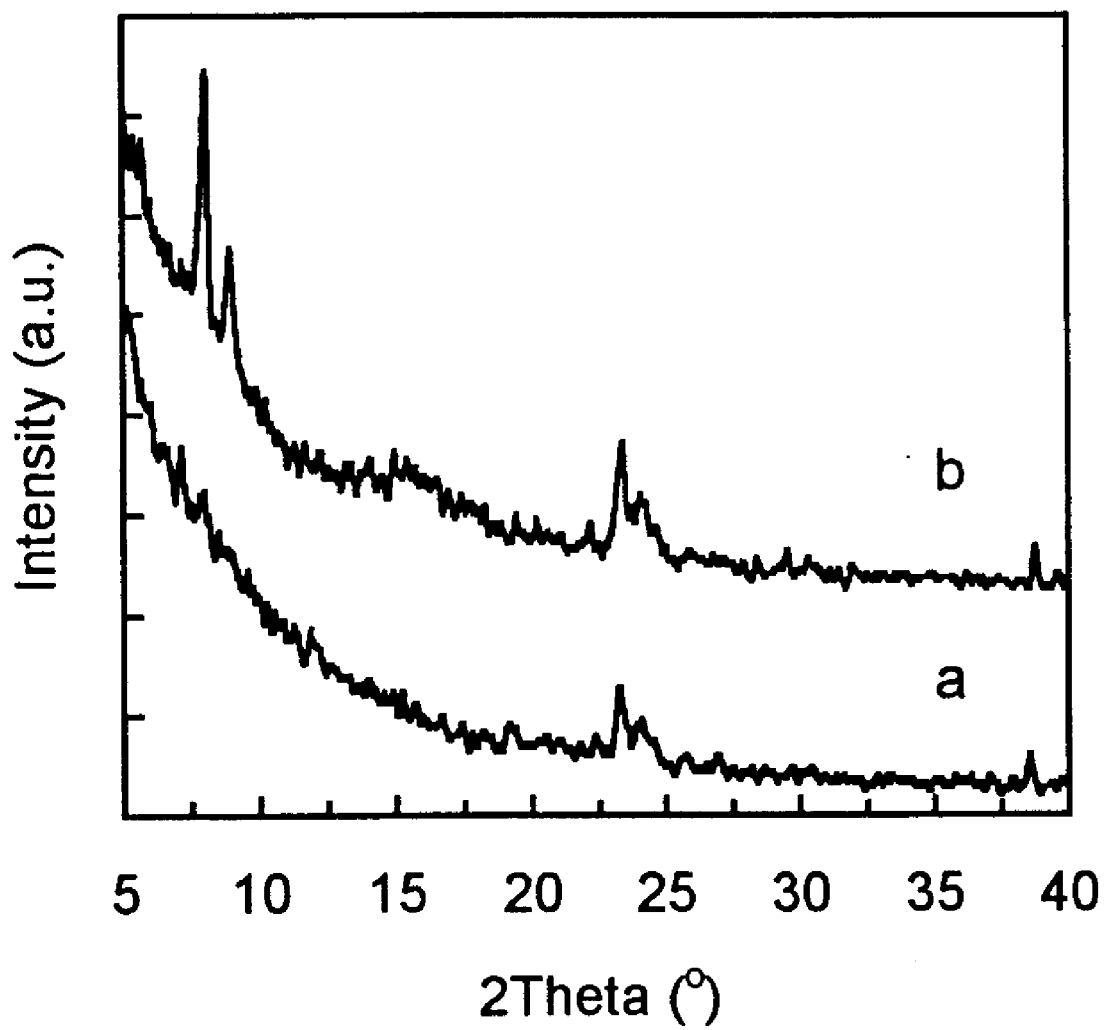
FIG. 10 depicts X-ray diffraction patterns for films in FIG. 9.

IR spectra of spin-on-only film ("a") and microwave treated (8 minutes) film ("b") are shown in FIG. 9. It is clear from the figure that the intensity of the characteristic framework vibration of pure-silica MFI increased due to microwave treatment. The result confirmed a secondary growth of spin-on film. Similar results were obtained from X-ray analyses of the films. FIG. 10 shows X-ray diffraction patterns of spin-on film before ("a") and after 8 minutes of microwave treatment ("b"). This figure clearly indicates increasing crystallinity of the spin-on film due to a secondary growth during microwave treatment.

Nitrogen adsorption performed on air-dried nanocrystals after a similar microwave treatment (e.g., 8 min) as applied to the spin-on film revealed a uniform inter-particle pore size of 22 nm and mesoporous volume of 0.34 cm$^3$/g. After 4 cycles of 8 min treatment, a uniform inter-particle pore size of 3 nm and an inter-particle pore volume of 0.08 cm$^3$/g were obtained. Thus the pore size and volume can also be adjusted by changing the cycle number of microwave treatment.

Polishing experiments indicated that the microwave-treated film strongly adhered to the substrate. The microwave-treated (8 min), calcined film exhibited a k value of 3.0 when a normal treatment was applied to wash the film. However, the same film (spin-on film #1) exhibited a much lower k value of 2.4 when it had been washed by immersing in deionized water for 2 days after microwave treatment.

EXAMPLE 5

Effect of Moisture on Zeolite Films

To study the effect of moisture on the k value, films that were untreated and that were treated by silylation to improve hydrophobicity were exposed to ambient air with 60% relative humidity. It has been reported that vapor phase silylation of pure-silica MFI film can be used to increase the hydrophobicity of the film. The change in k value was monitored against the exposure time.

Silylation (vapor phase) of pure-silica MFI films produced by the spin-on process with redispersed crystals was conducted at 300° C. for 1 h using gaseous chlorotrimethylsilane obtained by bubbling nitrogen through chlorotrimethylsilane at room temperature. Prior to silylation the film was dehydrated at 300° C. for 5 h under a flow of nitrogen. After silylation, the system was kept under nitrogen flow at 300° C. for another 3 h to remove unreacted chlorotrimethylsilane from the film.

Figure 11:
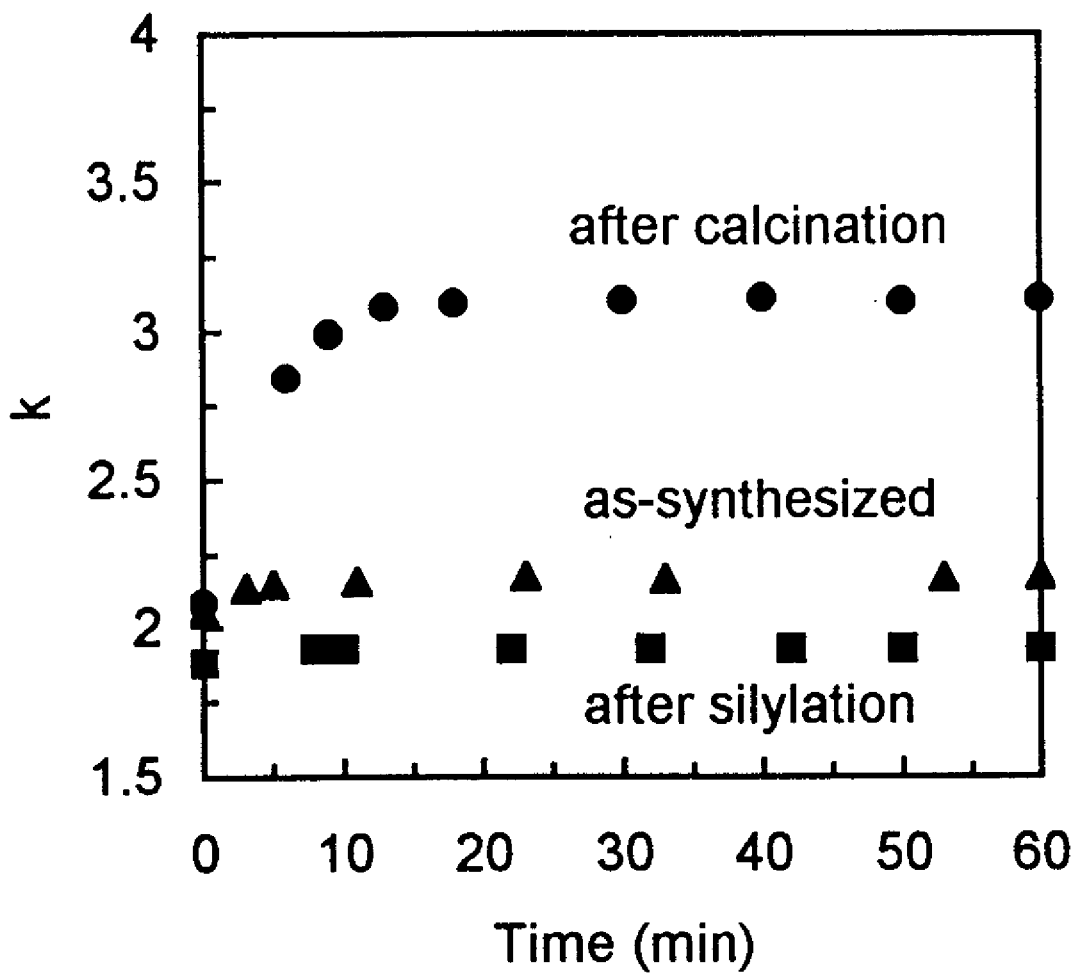
FIG. 11 depicts the dependence of the k value on the exposure time to air of 60% relative humidity for a pure-silica MFI film produced by spin-on with 3 spins of redispersed MFI nanocrystals.

FIG. 11 shows the effect of moisture on the spin-on films. The film thickness was 420 nm. No significant change of k value with exposure time was seen for an as-synthesized sample. This was expected because of the absence of microporosity. The k value was found to be around 2.2. The k value for a calcined sample increased moderately from 2.1 to 3.2 (i.e., 50% increase) within an exposure time of 1 hour. There was no significant change in the k value with exposure time for a silylated film, and the k value (1.8) was in the ultra low-k range. Microwave-treated film #1 had a k value of 2.2 after silylation.

Figure 3:
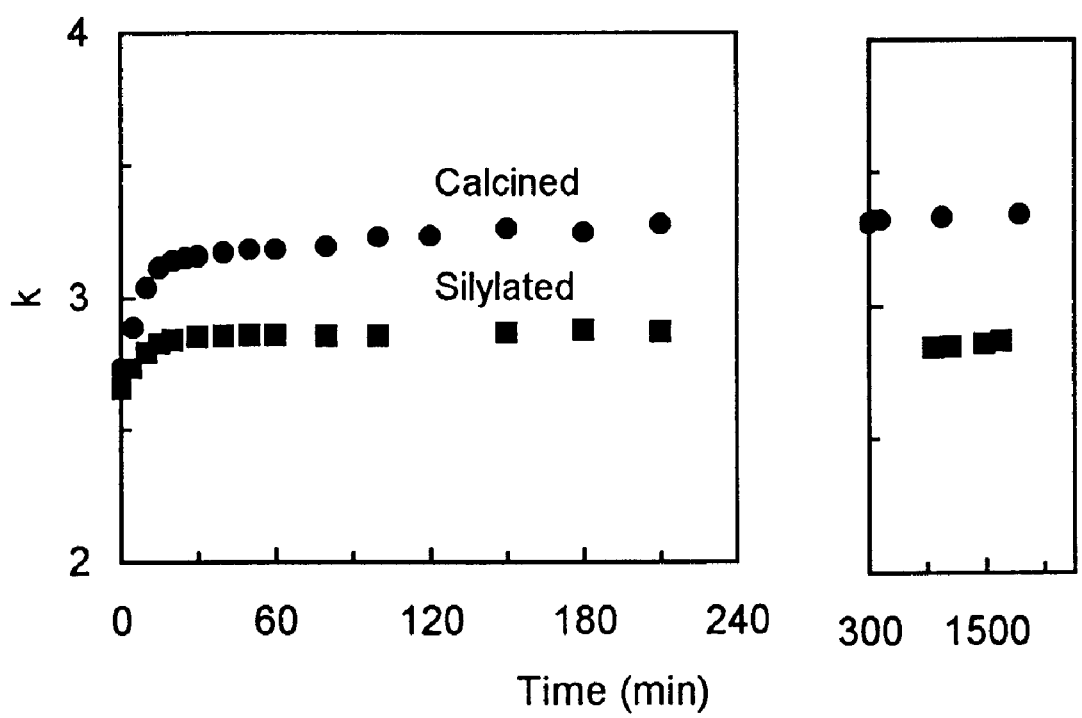
FIG. 3 depicts dependence on exposure time to air with 60% relative humidity of the dielectric constant k of a calcined pure-silica MFI film as shown in FIG. 1, and of one that has been treated by silylation.

The effect of moisture on in-situ crystallized pure-silica MFI film also was studied. As expected, there was not significant change of the k value with exposure time for an as-synthesized sample because of its hydrophobicity and nonporous nature. The k value for a calcined sample increased moderately from 2.7 to 3.3 (i.e., 22% increase) within an exposure time of 30 hours (FIG. 3). The k value eventually rose to 3.5 after several days. By contrast, moisture is known to have a pronounced effect on sol-gel silica and mesoporous silica that has not undergone dehydroxylation treatments (e.g., the k value of mesoporous silica increases more than 100% after exposure to moist air.) This clearly shows that the pure-silica MFI films are more hydrophobic than sol-gel silica and mesoporous silica. FIG. 3 shows the dependence of the k value on the exposure time for the silylated sample of in situ crystallized film. The increase of the k value slowed down after silylation, and the k value was lower than that of a calcined non-silylated film having the same exposure time.

EXAMPLE 6

Production of Spin-on Films with As-synthesized Zeolite Nanoparticle Suspension

This example illustrates the production of a silica zeolite film by the spin-on process, but without conducting separation and redispersion of the zeolite nanocrystals. Instead, this step is avoided by conducting the zeolite production step in the presence of added ethanol or other alcohol that is produce during the reaction. In this example, a zeolite pure-silican MFI nanoparticle suspension with a range of particle sizes was synthesized hydrothermally as in Example 2, with the difference that the molar composition of the synthesis composition was 0.36 TPAOH/1 TEOS/4 EtOH/ 14.9 H$_2$O. It is noted that complete in-situ hydrolysis of TEOS would produce 4 moles of ethanol, so that an equal molar amount of ethanol was added deliberately to the synthesis composition. The clear solution thus obtained was aged at ambient temperature for 3 days followed by heating in a capped plastic vessel at 80° C. for 3 days. Stirring was provided for both the aging and the heating process. The resulting colloidal suspension was cooled to room temperature under stirring.

The nanoparticle suspension was then centrifuged at 5000 rpm for 20 min to remove large particles, then spun on low resistivity silicon wafers. A Laurell spin coater was used; the spin rate was 3300 rpm for 30 sec. The film was heated in a flow of air at 1° C./min to 450° C. and held at that temperature for 3 h to bake the film and to remove the organic structure-directing agent (TPA).

Figure 12:
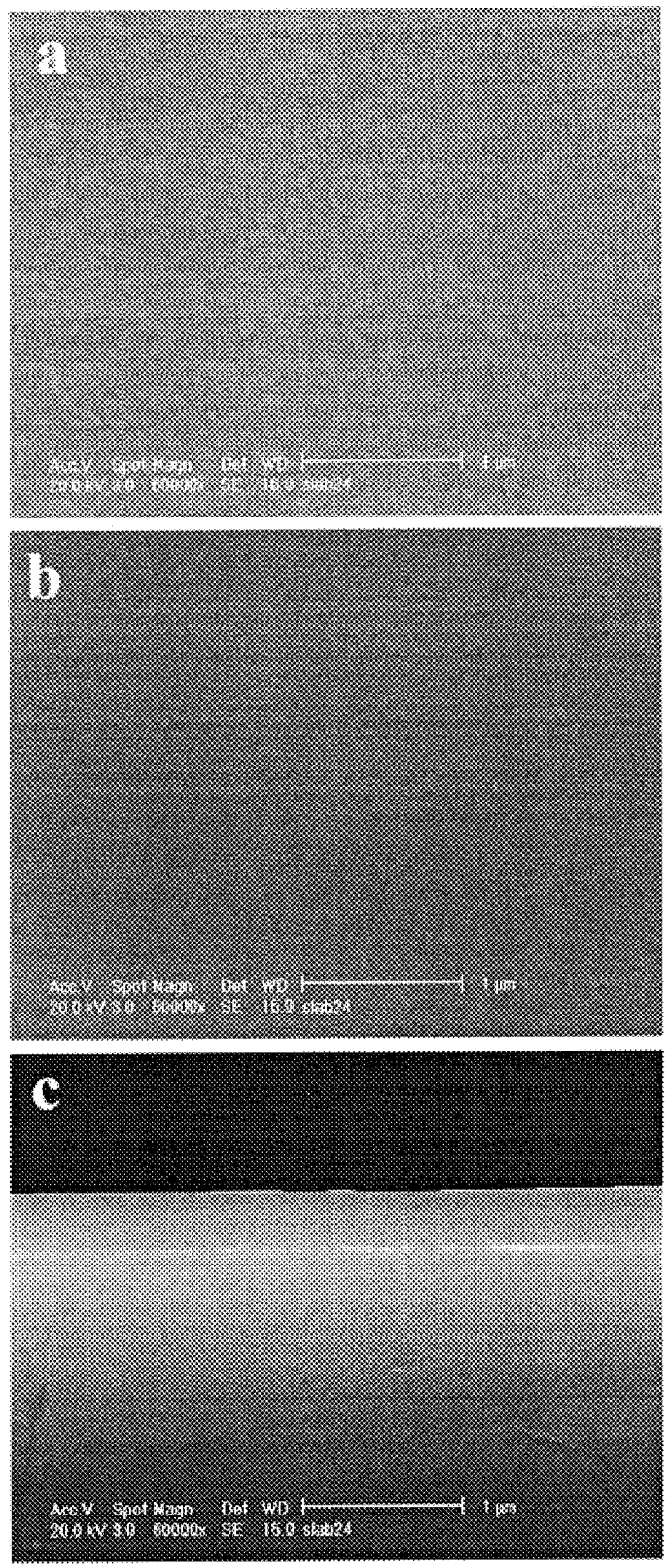
FIG. 12 comprises three SEM micrographs of pure-silica MFI films prepared by a spin-on process conducted without redispersion of zeolite crystals.

FIG. 12 contains SEM micrographs of the films. The as-deposited films were fairly smooth (FIG. 12a). The smoothness could be improved by a brief polishing with 0.05 μm alumina suspension using a Buehler polisher (FIG. 12b). No cracking or film delamination was observed during polishing, indicating good mechanical strength of the film and a strong adhesion to the silicon wafer. The film was about 0.33 μm thick (FIG. 12c).

Measurements of elastic modulus and hardness were performed using a Nano Indenter® XP and MTS' Continuous Stiffness Measurement (CSM) technique. With this technique, each indent gives the hardness and elastic modulus as a continuous function of the indenter's displacement into the sample. Loading was controlled such that the loading rate divided by the load was held constant at 0.05/sec. Experiments were terminated at a depth of 300 nanometers. Ten indentations were performed on each sample. Data from the 10 indents on each sample were averaged. The elastic modulus at 10% penetration was 16–18 GPa for a 0.42 μm-thick film.

Figure 14:
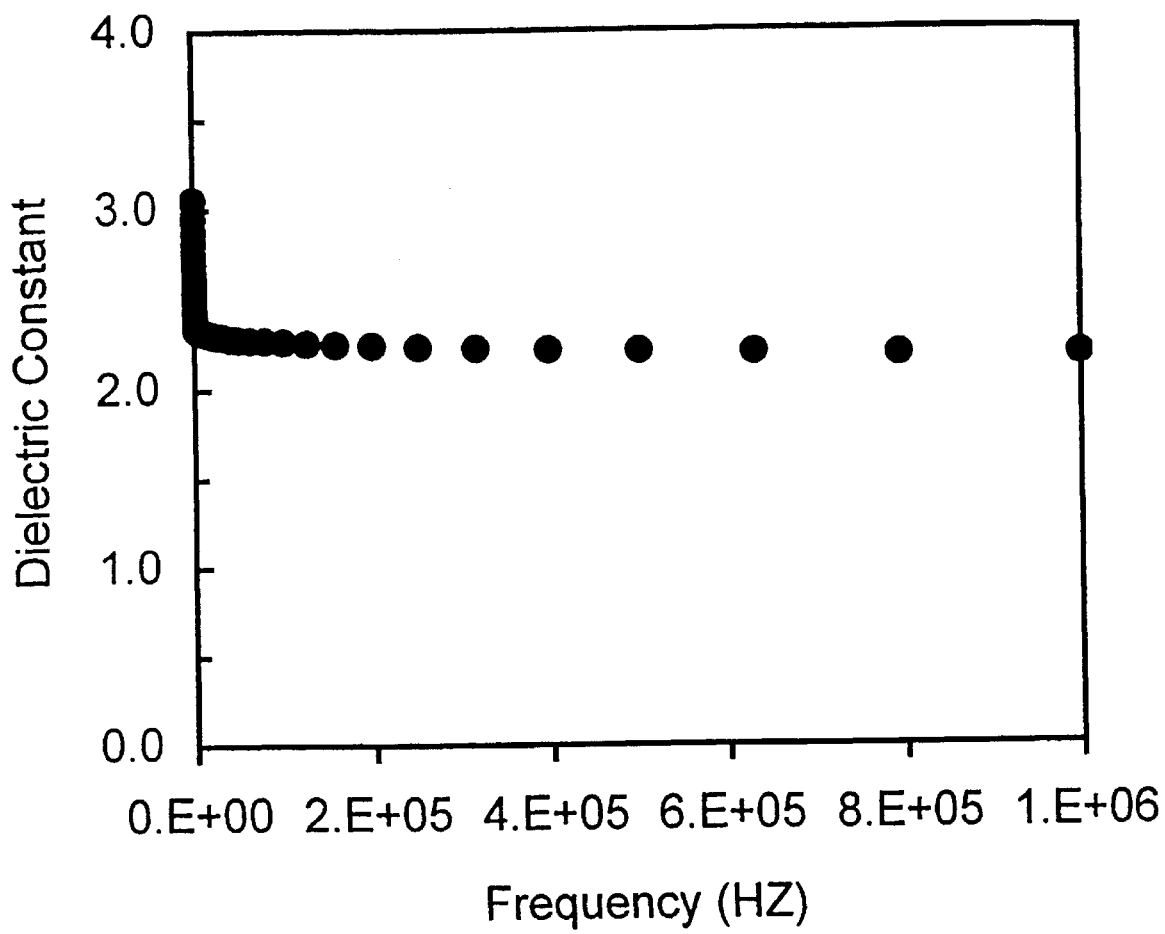
FIG. 14 depicts dielectric constant as a function of frequency for a calcined pure-silica MFI film produced from the film of FIG. 12.

The dielectric constant of the film was measured after thermal evaporation deposition (Denton Vacuum DV-502) of aluminum dots through a shadow mask. Dielectric constant was calculated by measuring capacitance of a metal-insulator-metal structure as before. Capacitance measurements show that calcined spin-on film has a k value of 2.3. The dielectric loss tangent of the film is about 0.02. The k value changes little with frequency at around 1 MHz (FIG. 14).

The films were exposed to ambient air with 50–60% relative humidity to study the effect of moisture adsorption. Change in the k value was monitored against the exposure time. The k value increased from 2.3 to 3.9 (i.e., 70% increase) within an hour of exposure.

Figure 13:
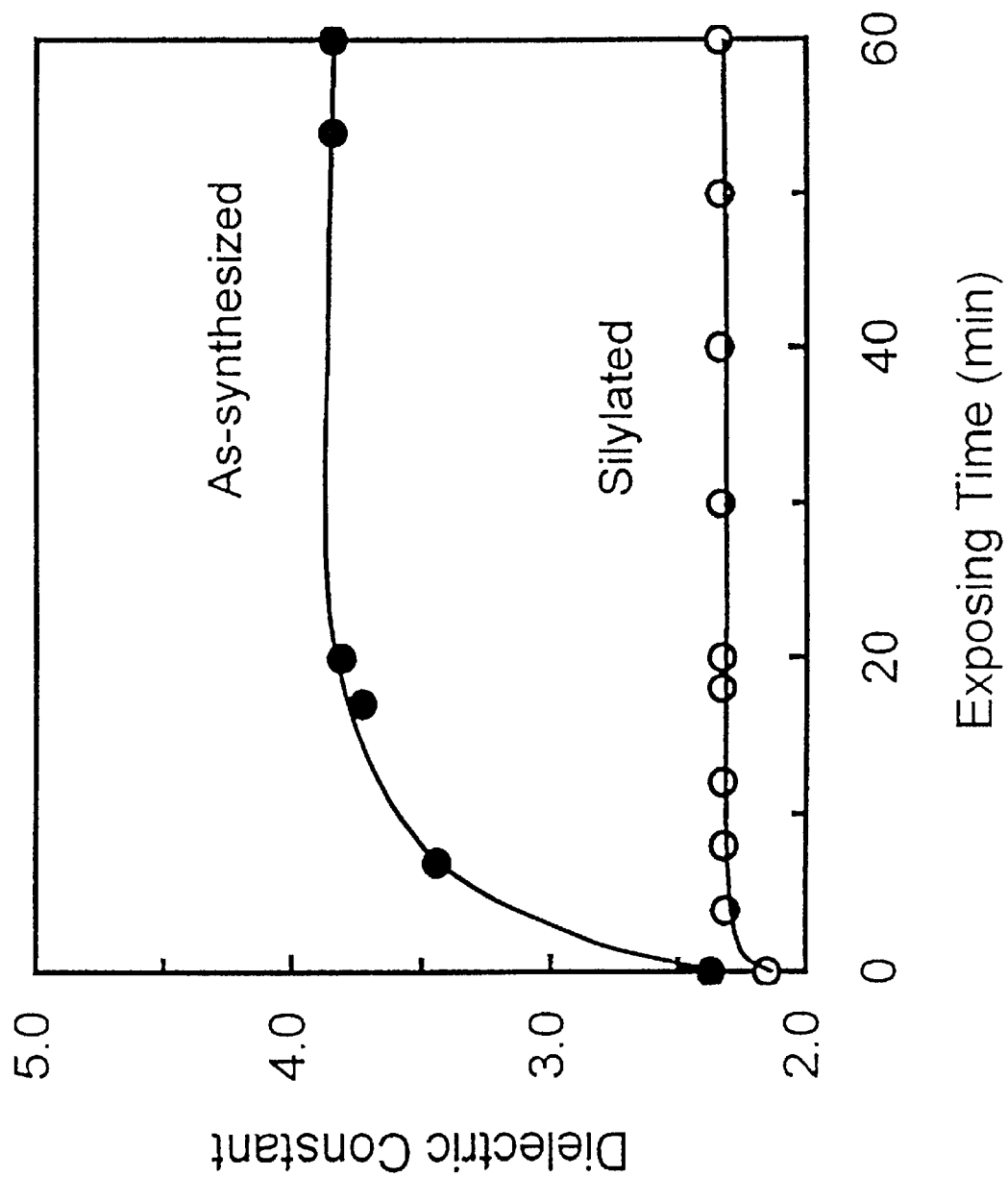
FIG. 13 shows the dependence of the dielectric constant (k) of an as-synthesized pure-silica MFI film of FIG. 12 on exposure time to air, with 50–60% relative humidity.

To increase hydrophobicity of the film, vapor phase silylation was conducted as before. The silylated film had a k value of 2.1, i.e., in the ultra low-k range. There was only a slight increase in the k value with exposure time (FIG. 13b).

Figure 15:
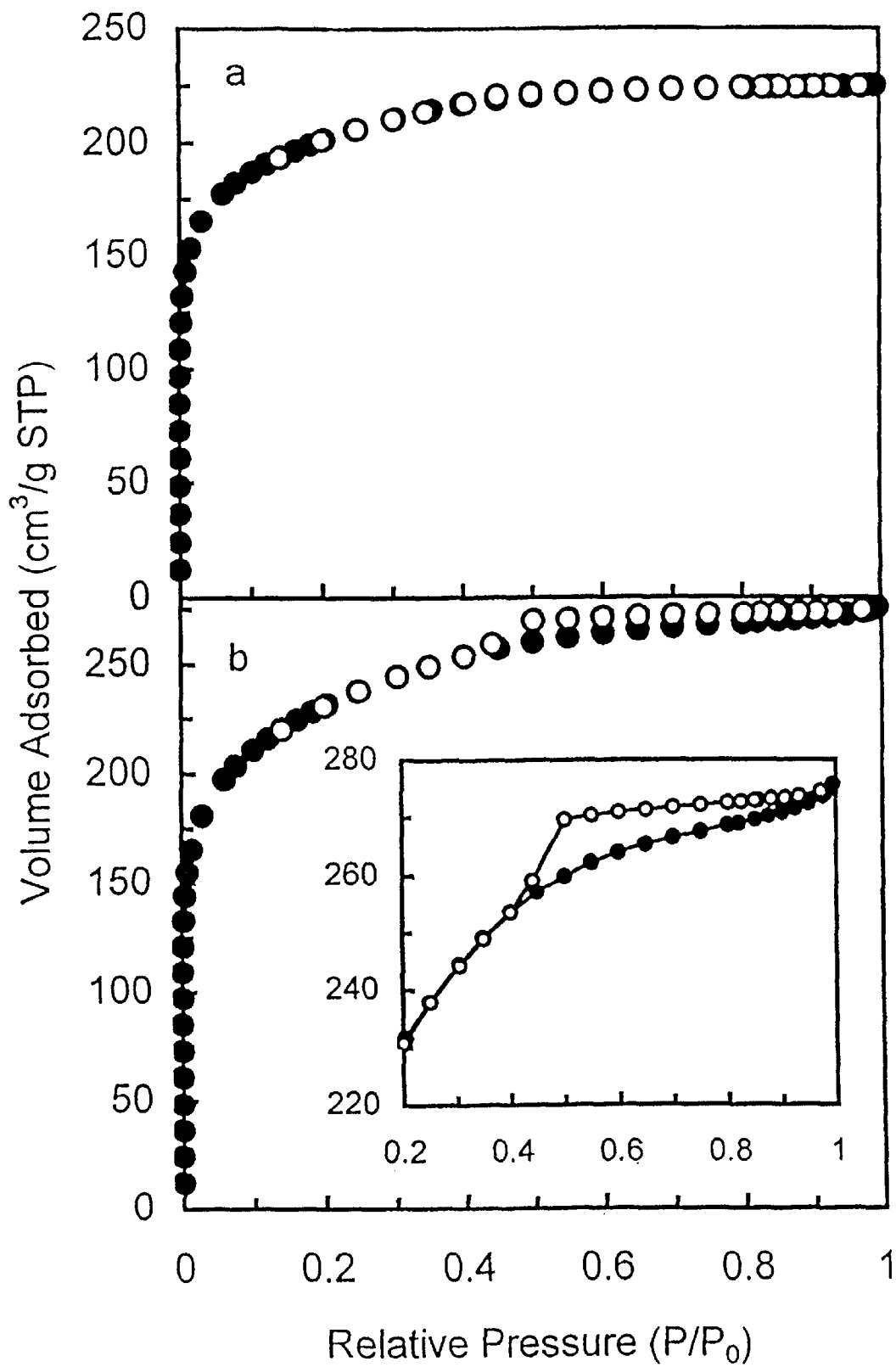
FIG. 15 depicts nitrogen adsorption-desorption isotherms of two bulk silica samples dried using two procedures: static drying (FIG. 15a) and flow-air drying (FIG. 15b)

For low-k applications, it is important to examine the porosity and pore size distribution of the porous film. FIG. 15 shows nitrogen adsorption-desorption isotherms of two bulk silica samples that have been dried with two different procedures. Results of detailed analysis of the isotherms are summarized in Table 1. Clearly both materials have bimodal pore size distribution (e.g., micropore at 0.55 nm and mesopore at about 2.7–2.8 nm).

TABLE 1

Results of $N_2$ adsorption for bulk materials from pure-silica MFI nanoparticle suspension. All materials calcined under a flow of air at 450° C. for 3 hours

| Drying condition | Micropore size (nm) | Micropore volume (cm³/g) [a] | Mesopore size (nm) | Mesopore volume (cm³/g) [b] | Total Porosity (%) [c] | Theoretical k [d] | Crystallinity (%) [e] |
|---|---|---|---|---|---|---|---|
| Static drying | 0.55 | 0.17 | 2.63 | 0.18 | 2.4 | 2.4 | 64 |
| Flow-air drying | 0.55 | 0.17 | 2.81 | 0.25 | 2.2 | 2.2 | 64 |

[a] Micropore volume was calculated by t-plot method.
[b] Mesopore volume = total volume – micropore volume.
[c] Assuming that the density of the dense material is 2.3 g/cm³.
[d] According to Bruggeman's effective medium approximation.
[e] By FT-IR analysis.

It also appears that drying conditions affect the porosity significantly and thus an appropriate drying procedure should be used. Specifically, drying under convection generates more mesoporosity (0.25 vs. 0.18 cm³/g). This result is reasonable if one considers that convection induces fast drying, during which the suspension quickly loses fluidity so that the particles settle in position quickly, leading to higher mesoporosity. The predicted k value for the silica dried convectively from Bruggeman's effective medium approximation [Morgan et al., Ann. Rev. Mater. Sci., 30, 645, 2000] is closer to the measured k value (2.2 vs. 2.1), suggesting that the silica materials obtained from convective drying is more representative of the spin-on film.

Figure 16:
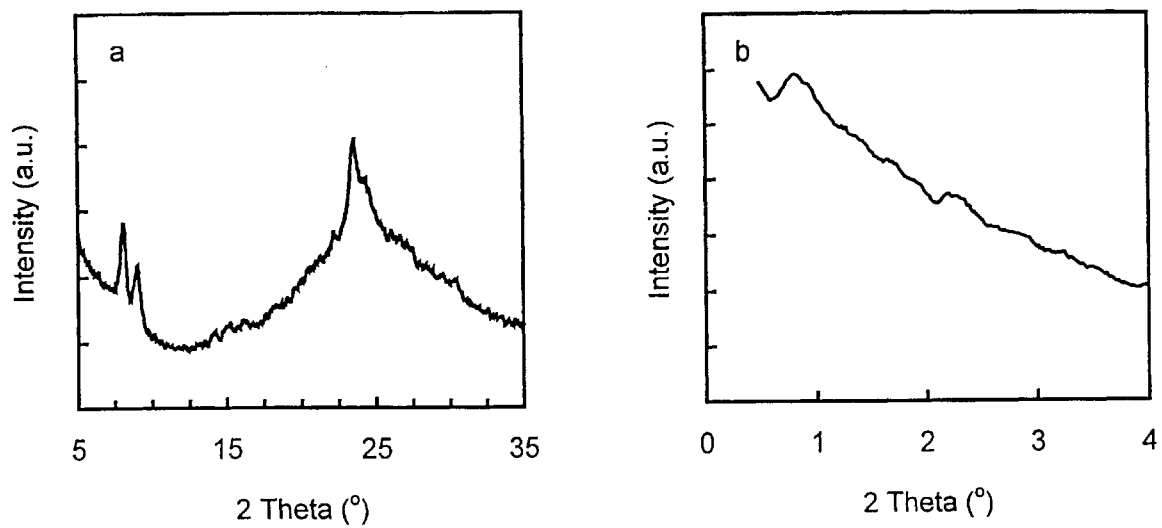
FIG. 16 depicts powder X-ray diffraction patterns for bulk materials from a zeolite nanoparticle suspension taken at wide and low angles.

X-ray diffraction (XRD) and infrared spectroscopy (IR) have also been used to characterize the porous silica. Wide angle X-ray diffraction (XRD) pattern suggests the existence of silicalite structure as well as amorphous silica (see FIG. 16). Low angle X-ray diffraction pattern of the material (see FIG. 16b) shows a poorly defined peak at 2θ≈0.83 (d=10.64 nm), probably due to the presence of mesopores owing to close packing of nanoparticles in the material. FT-IR spectrum (absorption band at about 550 cm$^{-1}$, not shown) also indicates the presence of pure-silica MFI zeolite structure and the crystallinity is estimated to be around 64% by using the intensity ratio of absorption bands at 550 and 450 cm$^{-1}$.

EXAMPLE 7

Production of Surface-patterned Film

Figure 17:
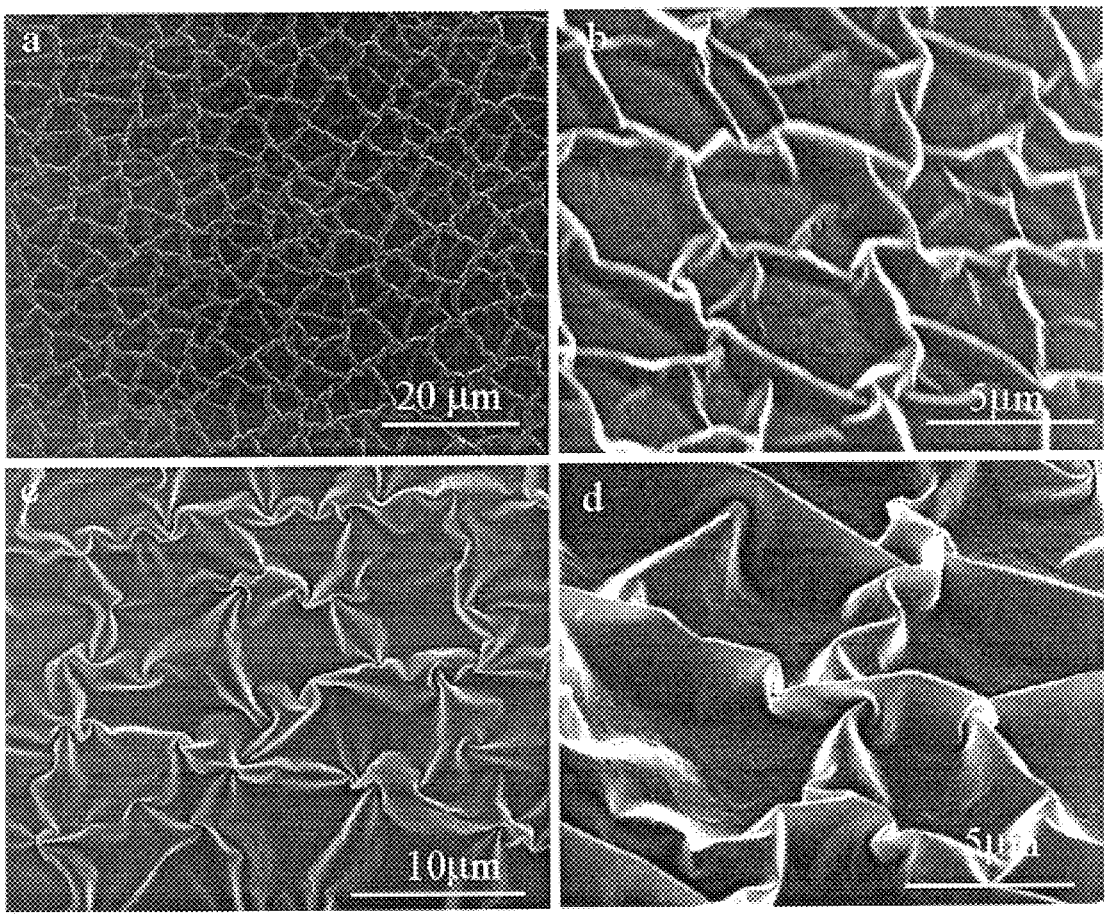
FIG. 17 comprises four SEM micrographs showing surface-patterned silica zeolite films.

Two batches of a zeolite pure-silica MFI nanoparticle suspension with a range of particle sizes were synthesized hydrothermally as in Example 6. One batch ("Batch A") was then heated at 70° C. for 9 days; the other ("Batch B") was heated at 80° C. for 3 days. The resulting suspensions were cooled to room temperature with stirring, and dropped onto horizontal clean-room grade silicon wafers, forming a liquid film about 2 mm thick, having a diameter of 2 cm. Drying at ambient temperatures produced surface patterns of the knotted-rope type in the film of Batch A and of the wrinkled-honeycomb type in Batch B. SEM micrographs of the films are shown in FIG. 17. The cells were slightly irregular in shape, and the edges were highly wrinkled. Nitrogen desorption measurements showed high Brunauer-Emmett-Teller surface areas for both films, and narrow pore size distributions for both, in both the micropore and mesopore regions.

What is claimed is:

1. A process for production of a silica zeolite film on a semiconductor substrate, comprising:

(a) combining a silica source selected from organic silica sources and inorganic silica sources with an organic hydroxide zeolite-structure-directing agent (SDA) and water to produce a zeolite synthesis composition containing the structure-directing agent, the silica source and water, in a molar ratio of x SDA: 1 silica source: y $H_2O$, wherein the value of x is from about 0.2 to about 0.6 and the value of y is from about 100 to about 200;

(b) contacting the substrate to be coated with the synthesis composition; and (c) heating the substrate and synthesis composition from step (b) to produce a silica zeolite film on the substrate.

2. A process according to claim 1 in which the value of x is from about 0.2 to about 0.45 and the value of y is from about 140 to about 180.

3. A process according to claim 1 in which the value of x is 0.32 and the value of y is 165.

4. A process according to claim 1 in which the silica source is a $C_1$–$C_2$ alkyl orthosilicate.

5. A process according to claim 1 in which the silica source is selected from fumed silica, silica gel and colloidal silica.

6. A process according to claim 1 in which the structure-directing agent is a quaternary ammonium hydroxide.

7. A process according to claim 1 in which the silica source is ethyl orthosilicate and the structure-directing agent is tetrapropylammonium hydroxide.

8. A process according to claim 1 further comprising (d) heating the substrate and film of step (c) to a temperature of from about 350 to about 550° C.

9. A process according to claim 1 further comprising treating the silica film of step (d) to remove surface hydroxyl groups therefrom.

10. A process according to claim 1 in which the silica zeolite is a high-silica MFI zeolite.

11. A process according to claim 1 in which the silica zeolite is a pure-silica MFI zeolite.

12. A process according to claim 1 in which the semiconductor substrate is a silicon wafer or a gallium arsenide wafer.

13. A process according to claim 1 in which the substrate comprises a silicon wafer or a gallium arsenide wafer and one or more metal layers or structures located on said wafer.

14. A semiconductor substrate having at least one silica zeolite film thereon produced by a process according to claim 1.

15. A semiconductor substrate according to claim 1 in which the at least one silica zeolite film is a pure-silica zeolite film.

16. A process for the production of a silica zeolite film on a semiconductor substrate, comprising:
(a) combining a silica source selected from organic silica sources and inorganic silica sources with an organic hydroxide zeolite-structure-directing agent (SDA) and water to produce a zeolite synthesis composition containing the structure-directing agent, the silica source and water in a molar ratio of $x_1$ SDA: 1 silica source: $y_1$ $H_2O$, wherein the value of $x_1$ is from about 0.2 to about 0.5 and the value of $y_1$ is from about 5 to about 30;
(b) heating the composition of step (a) to produce an aqueous colloidal suspension of silica zeolite crystals;
(c) separating the crystals from the product of step (b)
(d) dispersing the separated crystals from step (c) in a dispersing agent to form a suspension of the crystals in the dispersing agent,
(e) depositing the crystal suspension of step (d) on a semiconductor substrate; and
(f) rotating the substrate from step (e) under conditions so as to produce a silica zeolite film thereon by spin-coating.

17. A process according to claim 16 in which the value of $x_1$ is from about 0.3 to about 0.4 and the value of $y_1$ is from about 10 to about 20.

18. A process according to claim 16 in which the value of $x_1$ is 0.36 and the value of $y_1$ is 14.29.

19. A process according to claim 16 in which the silica source is a $C_1$–$C_2$ alkyl orthosilicate.

20. A process according to claim 16 in which the silica source is selected from fumed silica, silica gel and colloidal silica.

21. A process according to claim 16 in which the structure-directing agent is a quaternary ammonium hydroxide.

22. A process according to claim 16 in which the silica source is ethyl orthosilicate and the structure-directing agent is tetrapropylammonium hydroxide.

23. A process according to claim 1 further comprising (g) heating the film of step (f) to a temperature of from about 350 to about 550° C.

24. A process according to claim 23 further comprising treating the silica film of step (g) to remove surface hydroxyl groups therefrom.

25. A process according to claim 16 in which the silica zeolite is a high-silica MFI zeolite.

26. A process according to claim 16 in which the silica zeolite is a pure-silica MFI zeolite.

27. A process according to claim 16 in which the semiconductor substrate is a silicon wafer or a gallium arsenide wafer.

28. A process according to claim 16 in which the substrate comprises a silicon wafer or a gallium arsenide wafer and one or more metal layers or structures located on said wafer.

29. A semiconductor substrate having at least one silica zeolite film thereon produced by a process according to claim 16.

30. A semiconductor according to claim 29 wherein the at least one silica zeolite film is a pure-silica MFI zeolite film.

31. A process for the production of a silica zeolite film on a semiconductor substrate, comprising:
(a) combining a silica source selected from organic silica sources and inorganic silica sources with an organic hydroxide zeolite-structure-directing agent (SDA), water, and an alkanol selected from ethanol and methanol, to produce a zeolite synthesis composition containing the structure-directing agent, silica source, water and alkanol in a molar ratio of $x_2$ SDA: 1 silica source: $y_2$ $H_2O$: $z_2$ alkanol, wherein the value of $x_2$ is from about 0.2 to about 0.5, the value of $y_2$ is from about 10 to about 20, and the value of $z_2$ is from about 1 to about 30;
(b) heating the composition of step (a) to produce an aqueous colloidal suspension of silica zeolite crystals;
(c) depositing the crystal suspension of step (b) on a semiconductor substrate; and
(d) rotating the substrate from step (c) under conditions so as to produce a silica zeolite film thereon by spin coating.

32. A process according to claim 31 in which the value of $x_2$ is from about 0.3 to about 0.4, and the value of $y_2$ is from about 12 to about 18.

33. A process according to claim 31 in which the value of $x_2$ is 0.36, the value of $y_2$ is 14.29, and the value of $z_2$ is 4.0.

34. A process according to claim 31 in which the silica source is a $C_1$–$C_2$ alkyl orthosilicate.

35. A process according to claim 31 in which the silica source is selected from fumed silica, silica gel and colloidal silica.

36. A process according to claim 31 in which the structure-directing agent is a quaternary ammonium hydroxide.

37. A process according to claim 31 in which the silica source is ethyl orthosilicate, the template is tetrapropylammonium hydroxide, and the alkanol is ethanol.

38. A process according to claim 31 further comprising (e) heating the film of step (d) to a temperature of from about 350 to about 550° C.

39. A process according to claim 38 further comprising treating the silica film of step (e) to remove surface hydroxyl groups therefrom.

40. A process according to claim 31 in which the silica zeolite is a high-silica zeolite.

41. A process according to claim 31 in which the silica zeolite is a pure-silica MFI zeolite.

42. A process according to claim 31 in which the semiconductor substrate is a silicon wafer or a gallium arsenide wafer.

43. A process according to claim 31 in which the substrate comprises a silicon wafer or a gallium arsenide wafer and one or more metal layers or structures located on said wafer.

44. A semiconductor substrate having at least one silica zeolite film thereon produced by a process according to claim 31.

45. A semiconductor substrate according to claim 44 in which the at least one silica zeolite film is a pure-silica MFI zeolite film.

46. A process for producing a patterned silica zeolite film on a semiconductor substrate, comprising:

(a) combining a silica source selected from organic silica sources and inorganic silica sources with an organic hydroxide zeolite-structure-directing agent (SDA), water, and an alkanol selected from ethanol and methanol, to produce a zeolite synthesis composition containing the structure-directing agent, silica source, water and alkanol in a molar ratio of $x_3$ SDA: 1 silica source: $y_3$ H$_2$O: $z_3$ alkanol, wherein the value of $x_3$ is from about 0.2 to about 0.5, the value of $y_3$ is from about 10 to about 20, and the value of $z_3$ is from about 1 to about 30;

(b) heating the composition of step (a) to produce an aqueous colloidal suspension of silica zeolite crystals;

(c) depositing the crystal suspension of step (b) on a semiconductor substrate; and (d) drying the crystal suspension at ambient temperature to produce a patterned silica zeolite film.

47. A process according to claim 46 in which the value of $z_2$ 4.0.

48. A process according to claim 46 in which the silica source is a $C_1$–$C_2$ alkyl orthosilicate.

49. A process according to claim 46 in which the structure-directing agent is a quaternary ammonium hydroxide.

50. A process according to claim 46 in which the silica source is ethyl orthosilicate, the template is tetrapropylammonium hydroxide, and the alkanol is ethanol.

51. A process according to claim 46 in which the silica zeolite is a high-silica zeolite.

52. A process according to claim 46 in which the silica zeolite is a pure-silica MFI zeolite.

53. A process according to claim 46 in which the semiconductor substrate is a silicon wafer or a gallium arsenide wafer.

54. A process according to claim 46 in which the substrate comprises a silicon wafer or a gallium arsenide wafer and one or more metal layers or structures located on said wafer.

* * * * *